(12) United States Patent
Liu et al.

(10) Patent No.: US 10,930,360 B2
(45) Date of Patent: Feb. 23, 2021

(54) SHIFT REGISTER, DRIVING METHOD THEREOF, GATE DRIVING CIRCUIT, AND DISPLAY DEVICE

(71) Applicants: Ordos Yuansheng Optoelectronics Co., Ltd., Inner Mongolia (CN); BOE Technology Group Co., Ltd., Beijing (CN)

(72) Inventors: Peng Liu, Beijing (CN); Jun Fan, Beijing (CN); Yusheng Liu, Beijing (CN); Bailing Liu, Beijing (CN); Han Zhang, Beijing (CN); Zhen Wang, Beijing (CN); Yun Qiao, Beijing (CN); Zhengkui Wang, Beijing (CN); Lele Cong, Beijing (CN); Mei Li, Beijing (CN)

(73) Assignees: Ordos Yuansheng Optoelectronics Co., Ltd., Ordos (CN); BOE Technology Group Co., Ltd., Beijing (CN)

( * ) Notice: Subject to any disclaimer, the term of this patent is extended or adjusted under 35 U.S.C. 154(b) by 29 days.

(21) Appl. No.: 16/242,472

(22) Filed: Jan. 8, 2019

(65) Prior Publication Data
US 2019/0333597 A1 Oct. 31, 2019

(30) Foreign Application Priority Data
Apr. 26, 2018 (CN) .......................... 201810387334.7

(51) Int. Cl.
*G11C 19/00* (2006.01)
*G11C 19/28* (2006.01)
*G09G 3/20* (2006.01)

(52) U.S. Cl.
CPC ............. *G11C 19/287* (2013.01); *G09G 3/20* (2013.01); *G11C 19/28* (2013.01);
(Continued)

(58) Field of Classification Search
None
See application file for complete search history.

(56) References Cited

U.S. PATENT DOCUMENTS

| 2011/0002438 | A1 | 1/2011 | Kim |
| 2014/0300399 | A1 | 10/2014 | Miyake et al. |

(Continued)

FOREIGN PATENT DOCUMENTS

| CN | 104064153 A | 9/2014 |
| CN | 105096865 A | 11/2015 |

(Continued)

OTHER PUBLICATIONS

Notice of First Review Opinion and English language translation, Chinese Patent Application No. 201810387334.7, Mar. 30, 2020, 15 pp.

*Primary Examiner* — Tuan T Lam
(74) *Attorney, Agent, or Firm* — Myers Bigel, P.A.

(57) ABSTRACT

A shift register includes a first input sub-circuit configured to transfer a first input signal at a first input terminal to a first node in response to a first scan signal at a first scan terminal being active, a first level control sub-circuit configured to transfer a first power supply voltage at a first power supply terminal to a first output control node and a second output control node in response to the first node being at an active potential, and an output sub-circuit configured to transfer a first clock signal at a first clock terminal to a first output in response to the first output control node being at an active potential, and to transfer a second clock signal at a second clock terminal to a second output terminal in response to the second output control node being at an active potential.

20 Claims, 11 Drawing Sheets

(52) U.S. Cl.
CPC ............ *G09G 2300/0408* (2013.01); *G09G 2300/0426* (2013.01); *G09G 2310/027* (2013.01); *G09G 2310/0286* (2013.01); *G09G 2310/08* (2013.01)

(56) References Cited

U.S. PATENT DOCUMENTS

| | | |
|---|---|---|
| 2015/0077319 A1 | 3/2015 | Yao et al. |
| 2015/0332784 A1 | 11/2015 | Yan |
| 2017/0092172 A1* | 3/2017 | Wang ..................... G11C 19/00 |
| 2017/0330526 A1 | 11/2017 | Fan et al. |
| 2018/0174548 A1* | 6/2018 | Hao ..................... G11C 19/184 |
| 2019/0013083 A1* | 1/2019 | Wang ....................... G09G 3/20 |
| 2019/0080780 A1* | 3/2019 | Wang ..................... G11C 19/28 |
| 2019/0266971 A1* | 8/2019 | Hao ..................... H01L 27/0248 |
| 2019/0385556 A1* | 12/2019 | Guan ....................... G09G 3/20 |
| 2019/0385688 A1* | 12/2019 | Fu ............................ G09G 3/20 |
| 2020/0193886 A1* | 6/2020 | Hao ..................... G06F 3/0416 |

FOREIGN PATENT DOCUMENTS

| | | |
|---|---|---|
| JP | 2016-53719 A | 4/2016 |
| KR | 10-1350635 B1 | 1/2014 |

* cited by examiner

SHIFT REGISTER, DRIVING METHOD THEREOF, GATE DRIVING CIRCUIT, AND DISPLAY DEVICE

CROSS REFERENCE TO RELATED APPLICATIONS

This U.S. non-provisional patent application claims priority under 35 U.S.C. § 119 to Chinese patent application No. 201810387334.7 filed on Apr. 26, 2018, the entire disclosure of which is incorporated herein by reference.

TECHNICAL FIELD

Embodiments of the present disclosure relate to the field of display technologies, and in particular, to a shift register, a method of driving such a shift register, a gate driving circuit including the shift register, and a display device including the gate driving circuit.

BACKGROUND

With the development of display technology, display panels with high resolution and narrow bezel have become a trend, and the gate-driver-on-array (GOA) technique has emerged accordingly. With the GOA technique, a gate driving circuit of a display panel is directly integrated on the array substrate to replace a separate gate drive chip. The GOA circuit is typically implemented by a plurality of shift registers that convert a clock signal into on/off signals and output them to respective gate lines of the display panel.

SUMMARY

According to an aspect of the present disclosure, a shift register is provided, comprising: a first scan terminal configured to receive a first scan signal; a first input terminal configured to receive a first input signal; a first power supply terminal configured to receive a first power supply voltage; a second power supply terminal configured to receive a second power supply voltage; a first clock terminal configured to receive a first clock signal; a second clock terminal configured to receive a second clock signal; a first output terminal configured to output a first output signal; a second output terminal configured to output a second output signal; a first input sub-circuit configured to transfer the first input signal at the first input terminal to a first node in response to the first scan signal at the first scan terminal being active; a first level control sub-circuit configured to transfer the first power supply voltage at the first power supply terminal to a first output control node and a second output control node in response to the first node being at an active potential; and an output sub-circuit configured to transfer the first clock signal at the first clock terminal to the first output terminal as the first output signal in response to the first output control node being at an active potential, and to transfer the second clock signal at the second clock terminal to the second output terminal as the second output signal in response to the second output control node being at an active potential.

In some embodiments, the shift register further comprises: a third clock terminal configured to receive a third clock signal; a reset terminal configured to receive a reset signal; a second level control sub-circuit configured to transfer the third clock signal at the third clock terminal to a third node in response to the first scan signal at the first scan terminal being active; a third level control sub-circuit configured to transfer the first power supply voltage at the first power supply terminal to a third output control node in response to the third node being at an active potential, and to transfer the second power supply voltage at the second power supply terminal to the third output control node in response to the first node being at an active potential; and a reset sub-circuit configured to transfer the reset signal at the reset terminal to the third output control node in response to the reset signal at the reset terminal being active, and to transfer the second power supply voltage at the second supply terminal to the second node, the first output terminal, and the second output terminal in response to the third output control node being at an active potential.

In some embodiments, the shift register further comprises: a second scan terminal configured to receive a second scan signal; a second input terminal configured to receive a second input signal; a fourth clock terminal configured to receive a fourth clock signal; a second input sub-circuit configured to transfer the second input signal at the second input terminal to the first node in response to the second scan signal at the second scan terminal being active; and a fourth level control sub-circuit configured to transfer the fourth clock signal at the fourth clock terminal to the third node in response to the second scan signal at the second scan terminal being active.

In some embodiments, the first input sub-circuit comprises a first transistor comprising a control electrode connected to the first scan terminal, a first electrode connected to the first input terminal, and a second electrode connected to the first node. The first level control sub-circuit comprises: a second transistor comprising a control electrode connected to the first node, a first electrode connected to the first power supply terminal, and a second electrode connected to the second node; a third transistor comprising a control electrode connected to the first power supply terminal, a first electrode connected to the second node, and a second electrode connected to the first output control node; a fourth transistor comprising a control electrode connected to the first power supply terminal, a first electrode connected to the second node, and a second electrode connected to the second output control node; a first capacitor comprising a first terminal connected to the second node and a second terminal connected to the second power supply terminal. The output sub-circuit comprises: a fifth transistor comprising a control electrode connected to the first output control node, a first electrode connected to the first clock terminal, and a second electrode connected to the first output terminal; and a sixth transistor comprising a control electrode connected to the second output control node, a first electrode connected to the second clock terminal, and a second electrode connected to the second output terminal.

In some embodiments, the second level control sub-circuit comprises a seventh transistor comprising a control electrode connected to the first scan terminal, a first electrode connected to the third clock terminal, and a second electrode connected to the third node. The third level control sub-circuit comprises: an eighth transistor comprising a control electrode connected to the third node, a first electrode connected to the first power supply terminal, and a second electrode connected to the third output control node; a ninth transistor comprising a control electrode connected to the first node, a first electrode connected to the third output control node, and a second electrode connected to the second power supply terminal; and a second capacitor comprising a first terminal connected to the third output control node and a second terminal connected to the second power supply terminal. The reset sub-circuit comprises: a tenth transistor comprising a control electrode connected to the third output control node, a first electrode connected to the second node, and a second electrode connected to the second power supply terminal; an eleventh transistor comprising a control electrode connected to the third output control node, a first electrode connected to the first output terminal, and a second electrode connected to the second power supply terminal; a twelfth transistor comprising a control electrode connected to the third output control node, a first electrode connected to the second output terminal, and a second electrode connected to the second power supply terminal; and a thirteenth transistor comprising a control electrode connected to the reset terminal, a first electrode connected to the reset terminal, and a second electrode connected to the third output control node.

In some embodiments, the second input sub-circuit comprises a fourteenth transistor comprising a control electrode connected to the second scan terminal, a first electrode connected to the first node, and a second electrode connected to the second input terminal. The fourth level control sub-circuit comprises a fifteenth transistor comprising a control electrode connected to the second scan terminal, a first electrode connected to the third node, and a second electrode connected to the fourth clock terminal.

In some embodiments, the shift register further comprises: a first control terminal configured to receive a first control signal; a second control terminal configured to receive a second control signal; a touch control sub-circuit configured to transfer the second power supply voltage at the second power supply terminal to the first output terminal and the second output terminal in response to the first control signal at the first control terminal being active; and a display control sub-circuit configured to transfer the second control signal at the second control terminal to the first output terminal and the second output terminal in response to the second control signal at the second control terminal being active.

In some embodiments, the touch control sub-circuit comprises a sixteenth transistor comprising a control electrode connected to the first control terminal, a first electrode connected to the second power supply terminal, and a second electrode connected to the first output terminal and the second output terminal. The display control sub-circuit comprises a seventeenth transistor comprising a control electrode connected to the second control terminal, a first electrode connected to the second control terminal, and a second electrode connected to the first output terminal and the second output terminal.

In some embodiments, the first input sub-circuit comprises a first transistor comprising a control electrode connected to the first scan terminal, a first electrode connected to the first input terminal, and a second electrode connected to the first node. The first level control sub-circuit comprises: a second transistor comprising a control electrode connected to the first node, a first electrode connected to the first power supply terminal, and a second electrode connected to the second node; a third transistor comprising a control electrode connected to the first power supply terminal, a first electrode connected to the second node, and a second electrode connected to the first output control node; a fourth transistor comprising a control electrode connected to the first power supply terminal, a first electrode connected to the second node, and a second electrode connected to the second output control node; and a first capacitor comprising a first terminal connected to the second node and a second terminal connected to the second power supply terminal. The output sub-circuit comprises: a fifth transistor comprising a control electrode connected to the first output control node, a first electrode connected to the first clock terminal, and a second electrode connected to the first output terminal; and a sixth transistor comprising a control electrode connected to the second output control node, a first electrode connected to the second clock terminal, and a second electrode connected to the second output terminal. The second level control sub-circuit comprises a seventh transistor comprising a control electrode connected to the first scan terminal, a first electrode connected to the third clock terminal, and a second electrode connected to the third node. The third level control sub-circuit comprises: an eighth transistor comprising a control electrode connected to the third node, a first electrode connected to the first power supply terminal, and a second electrode connected to the third output control node; a ninth transistor comprising a control electrode connected to the first node, a first electrode connected to the third output control node, and a second electrode connected to the second power supply terminal; and a second capacitor comprising a first terminal connected to the third output control node and a second terminal connected to the second power supply terminal. The reset sub-circuit comprises: a tenth transistor comprising a control electrode connected to the third output control node, a first electrode connected to the second node, and a second electrode connected to the second power supply terminal; an eleventh transistor comprising a control electrode connected to the third output control node, a first electrode connected to the first output terminal, and a second electrode connected to the second power supply terminal; a twelfth transistor comprising a control electrode connected to the third output control node, a first electrode connected to the second output terminal, and a second electrode connected to the second power supply terminal; and a thirteenth transistor comprising a control electrode connected to the reset terminal, a first electrode connected to the reset terminal, and a second electrode connected to the third output control node. The second input sub-circuit comprises a fourteenth transistor comprising a control electrode connected to the second scan terminal, a first electrode connected to the first node, and a second electrode connected to the second input terminal. The fourth level control sub-circuit comprises a fifteenth transistor comprising a control electrode connected to the second scan terminal, a first electrode connected to the third node, and a second electrode connected to the fourth clock terminal.

According to another aspect of the present disclosure, a gate driving circuit is provided, comprising: N cascaded shift registers as described above, N being a positive integer and N≥4. The first input terminal of a 1st one or the second input terminal of an N-th one of the N shift registers is configured to receive a start signal. The second output terminal of a k-th one of the N shift registers is connected to the first input terminal of a (k+1)-th one of the N shift registers, k being a positive integer and 1≤k<N. The first output terminal of the (k+1)-th shift register is connected to the second input terminal of the k-th shift register.

In some embodiments, the first clock terminals of the N shift registers are configured to receive a same first clock signal, the second clock terminals of the N shift registers are configured to receive a same second clock signal, the third clock terminals of the N shift registers are configured to receive a same third clock signal, and the fourth clock terminals of the N shift registers are configured to receive a same fourth clock signal.

According to yet another aspect of the present disclosure, a method of driving a shift register is provided. The shift register comprises: a first scan terminal configured to receive a first scan signal; a second scan terminal configured to receive a second scan signal; a first input terminal configured to receive a first input signal; a second input terminal configured to receive a second input signal; a first power supply terminal configured to receive a first power supply voltage; a second power supply terminal configured to receive a second a power supply voltage; a first clock terminal configured to receive a first clock signal; a second clock terminal configured to receive a second clock signal; a third clock terminal configured to receive a third clock signal; a fourth clock terminal configured to receive a fourth clock signal; a first output terminal configured to output a first output signal; a second output terminal configured to output a second output signal; a reset terminal configured to receive a reset signal; a first input sub-circuit; a first level control sub-circuit; an output sub-circuit; a second level control sub-circuit; a third level control sub-circuit; a reset sub-circuit; and a second input sub-circuit. The method comprising: at an input phase: transferring, by one of the first input sub-circuit and the second input sub-circuit, an input signal to a first node, and transferring, by the first level control sub-circuit, the first power supply voltage at the first power supply terminal to a first output control node and a second output control node in response to the first node being at an active potential; and at an output phase subsequent to the input phase: transferring, by the output sub-circuit, the first clock signal at the first clock terminal to the first output terminal as the first output signal in response to the first output control node being at an active potential, and transferring, by the output sub-circuit, the second clock signal at the second clock terminal to the second output terminal as the second output signal in response to the second output control node being at an active potential.

In some embodiments, the method further comprises: at an initialization phase prior to the input phase: transferring, by the reset sub-circuit, the reset signal at the reset terminal to a third output control node in response to the reset signal at the reset terminal being active, and transferring, by the reset sub-circuit, the second power supply voltage at the second power supply terminal to a second node, the first output terminal and the second output terminal in response to the third output control node being at an active potential; and at a hold phase subsequent to the output phase: transferring, by the second level control sub-circuit, the third clock signal at the third clock terminal to a third node in response to the first scan signal at the first scan terminal being active, transferring, by the third level control sub-circuit, the first power supply voltage at the first power supply terminal to the third output control node in response to the third node being at an active potential, transferring, by the third level control sub-circuit, the second power supply voltage at the second power supply terminal to the third output control node in response to the first node being at an active potential, and transferring, by the reset sub-circuit, the second power supply voltage at the second power supply terminal to the second node, the first output terminal, and the second output terminal in response to the third output control node being at an active potential.

In some embodiments, the shift register further comprises: a first control terminal configured to receive a first control signal; and a second control terminal configured to receive a second control signal; a touch control sub-circuit; and a display control sub-circuit. The method further comprises: transferring, by the touch control sub-circuit, the second power supply voltage at the second power supply terminal to the first output terminal and the second output terminal in response to the first control signal at the first control terminal being active; and transferring, by the display control sub-circuit, the second control signal at the second control terminal to the first output terminal and the second output terminal in response to the second control signal at the second control terminal being active.

In some embodiments, the transferring the input signal to the first node at the input phase comprises: transferring, by the first input sub-circuit, the first input signal at the first input terminal to the first node in response to a forward scan mode in which the first scan signal is active; and transferring, by the second input sub-circuit, the second input signal at the second input terminal to the first node in response to a reverse scan mode in which the second scan signal is active.

According to still yet another aspect of the present disclosure, a display device is provided comprising the gate driving circuit as described above.

BRIEF DESCRIPTION OF THE DRAWINGS

Further details, features and advantages of the present disclosure are disclosed in the following description of exemplary embodiments in conjunction with the accompanying drawings in which.

In the drawings, like reference signs refer to like elements throughout.

DETAILED DESCRIPTION

Figure 1:
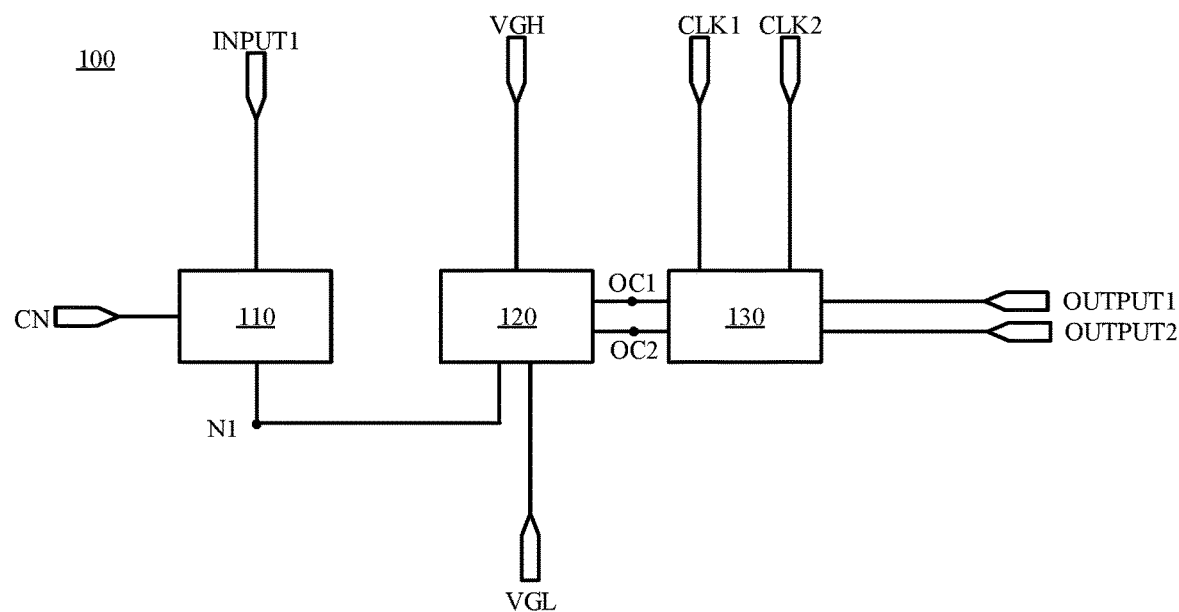
FIG. 1 is a schematic block diagram of a shift register in accordance with an embodiment of the present disclosure.

It will be understood that, although the terms first, second, third etc. may be used herein to describe various elements, components and/or sections, these elements, components and/or sections should not be limited by these terms. These terms are only used to distinguish one element, component or section from another. Thus, a first element, component or section discussed below could be termed a second element, component or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being "connected to", or "coupled to" another element, it can be directly connected or coupled to the other element, or intervening elements may be present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The term transistor as used herein may refer to a thin film transistor or other device having the same characteristics. The thin film transistor may be, for example, a metal oxide semiconductor transistor. The transistor is typically fabricated such that its source and drain are symmetrical and can be used interchangeably. Without loss of generality, the gate is referred to as a control electrode, one of the source and drain is referred to as a first electrode, and the other of the source and drain is referred to as a second electrode.

The term "active potential" as used herein refers to a potential at which the associated circuit component (e.g., a transistor) is enabled. Conversely, the "inactive potential" refers to a potential at which the associated circuit component is disabled. For an N-type transistor, the active potential is high and the inactive potential is low. For a P-type transistor, the active potential is low and the inactive potential is high. It will be understood that the active potential or the inactive potential is not intended to refer to a particular potential, but may include a range of potentials. Additionally, the term level is intended to be used interchangeably with potential. In this sense, the phrase "signal being active" means that the signal has an active level.

FIG. 1 is a schematic block diagram of a shift register 100 in accordance with an embodiment of the present disclosure. As shown in FIG. 1, the shift register 100 includes a first input sub-circuit 110, a first level control sub-circuit 120, and an output sub-circuit 130.

The first input sub-circuit 110 is connected to a first scan terminal CN for receiving a first scan signal, a first input terminal INPUT1 for receiving a first input signal, and a first node N1. The first input sub-circuit 110 is configured to transfer the first input signal at the first input terminal INPUT1 to the first node N1 in response to the first scan signal at the first scan terminal CN being active.

The first level control sub-circuit 120 is connected to the first node N1, a first power supply terminal VGH for receiving a first power supply voltage, a second power supply terminal VGL for receiving a second power supply voltage, a first output control node OC1, and a second output control nodes OC2. The first level control sub-circuit 120 is configured to transfer the first power supply voltage at the first power supply terminal VGH to the first output control node OC1 and the second output control node OC2 in response to the first node N1 being at an active potential.

The output sub-circuit 130 is connected to the first output control node OC1, the second output control node OC2, a first clock terminal CLK1 for receiving a first clock signal, and a second clock terminal CLK2 for receiving a second clock signal, a first output terminal OUTPUT1 for outputting a the first output signal, and a second output terminal OUTPUT2 for outputting a second output signal. The output sub-circuit 130 is configured to transfer the first clock signal at the first clock terminal CLK1 to the first output terminal OUTPUT1 as the first output signal in response to the first output control node OC1 being at an active potential, and to transfer the second clock signal at the second clock terminal CLK2 to the second output terminal OUTPUT2 as the second output signal in response to the second output control node OC2 being at an active potential.

The first output terminal OUTPUT1 and the second output terminal OUTPUT2 output the first output signal and the second output signal, respectively. These two signals can be supplied to different gate lines as gate driving signals. By outputting two gate driving signals from a single shift register 100, the gate driving circuit can include a reduced number of shift registers, resulting in reduced circuit footprint. This facilitates a narrow bezel design and reduces costs.

Figure 2:
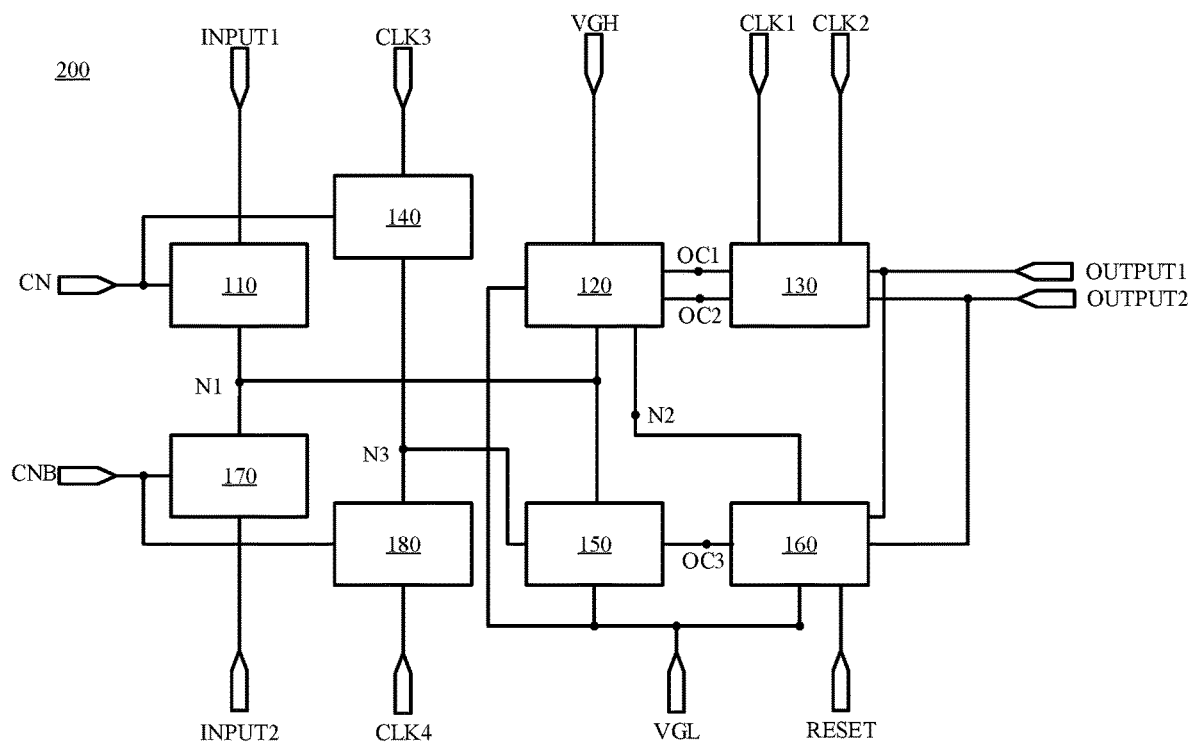
FIG. 2 is a schematic block diagram of a shift register in accordance with another embodiment of the present disclosure.

FIG. 2 is a schematic block diagram of a shift register 200 in accordance with another embodiment of the present disclosure. As shown in FIG. 2, in addition to the first input sub-circuit 110, the first level control sub-circuit 120, and the output sub-circuit 130, the shift register 200 further includes a second level control sub-circuit 140, a third level control sub-circuit 150, and reset sub-circuit 160.

The second level control sub-circuit 140 is connected to the first scan terminal CN, a third clock terminal CLK3 for receiving a third clock signal, and a third node N3. The second level control sub-circuit 140 is configured to transfer the third clock signal at the third clock terminal CLK3 to the third node N3 in response to the first scan signal at the first scan terminal CN being active.

The third level control sub-circuit 150 is connected to the first node N1, the third node N3, a third output control node OC3, the first power supply terminal VGH, and the second power supply terminal VGL. The third level control sub-circuit 150 is configured to transfer the first power supply voltage at the first power supply terminal VGH to the third output control node OC3 in response to the third node N3 being at an active potential, and to transfer the second power supply voltage at the second power supply terminal VGL to the third output control node OC3 in response to the first node N1 being at an active potential.

The reset sub-circuit 160 is connected to a reset terminal RESET for receiving a reset signal, the third output control node OC3, a second node N2, the first output terminal OUTPUT1, the second output terminal OUTPUT2, and the second power supply terminal VGL. The reset sub-circuit 160 is configured to transfer the reset signal at the reset terminal RESET to the third output control node OC3 in response to the reset signal at the reset terminal RESET being active, and to transfer the second power supply voltage at the second power supply terminal VGL to the second node N2, the first output terminal OUTPUT1, and the second output terminal OUTPUT2 in response to the third output control node OC3 being at an active potential.

In the present embodiment, by adding the second level control sub-circuit 140, the third level control sub-circuit 150, and the reset sub-circuit 160, the noise in the shift register 200 can be reduced.

As shown in FIG. 2, the shift register 200 may further include a second input sub-circuit 170 and a fourth level control sub-circuit 180.

The second input sub-circuit 170 is connected to a second scan terminal CNB for receiving a second scan signal, a second input terminal INPUT2 for receiving a second input signal, and the first node N1. The second input sub-circuit 170 is configured to transfer the second input signal at the second input INPUT2 to the first node N1 in response to the second scan signal at the second scan terminal CNB being active.

The fourth level control sub-circuit 180 is connected to the second scan terminal CNB, a fourth clock terminal CLK4 for receiving a fourth clock signal, and the third node N3. The fourth level control sub-circuit 180 is configured to transfer the fourth clock signal at the fourth clock terminal CLK4 to the third node N3 in response to the second scan signal at the second scan terminal CNB being active.

As described later with respect to the gate driving circuit embodiments, in a forward scan mode, the first scan terminal CN and the second scan terminal CNB are supplied with an active signal and an inactive signal, respectively, and in a reverse scan mode, the first scan terminal CN and the second scan terminal CNB are supplied with an inactive signal and an active signal, respectively.

By adding the second input sub-circuit 170 and the fourth level control sub-circuit 180, the shift register 200 can be provided with the forward scan mode and the reverse scan mode, thereby improving the applicability of the shift register 200.

Figure 3:
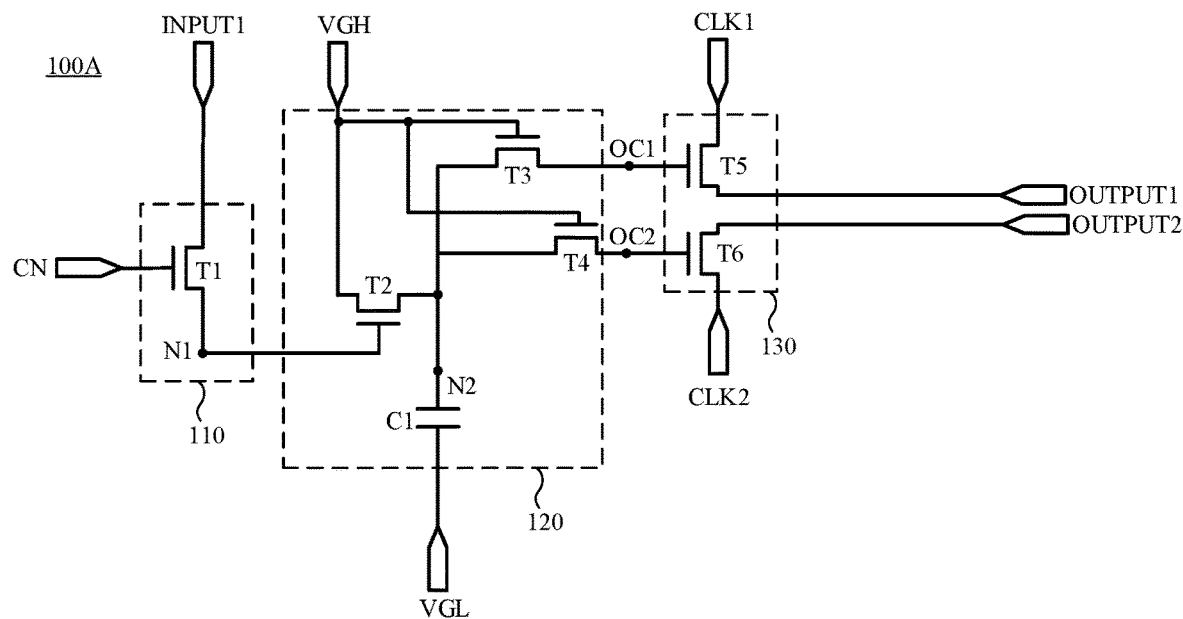
FIG. 3 is a circuit diagram of an example circuit of the shift register of FIG. 1.

FIG. 3 is a circuit diagram of an example circuit 100A of the shift register 100 of FIG. 1. In the following, the transistors are illustrated and described as N-type transistors (having a high gate-on voltage and a low gate-off voltage). Accordingly, the first power supply voltage at the first power supply terminal VGH has a high level, and the second power supply voltage at the second power supply terminal VGL has a low level.

The first input sub-circuit includes 110 a first transistor T1 including a control electrode connected to the first scan terminal CN, a first electrode connected to the first input terminal INPUT1, and a second electrode connected to the first node N1.

The first level control sub-circuit 120 includes a second transistor T2, a third transistor T3, a fourth transistor T4, and a first capacitor C1. The second transistor T2 includes a control electrode connected to the first node N1, a first electrode connected to the first power supply terminal VGH, and a second electrode connected to the second node N2. The third transistor T3 includes a control electrode connected to the first power supply terminal VGH, a first electrode connected to the second node N2, and a second electrode connected to the first output control node OC1. The fourth transistor T4 includes a control electrode connected to the first power supply terminal VGH, a first electrode connected to the second node N2, and a second electrode connected to the second output control node OC2. The first capacitor C1 includes a first terminal connected to the second node N2 and a second terminal connected to the second power supply terminal VGL. In the case where the second transistor T2 is turned on, the first capacitor C1 is charged with the first power supply voltage VGH at the first power supply terminal VGH. In the case where the second transistor T2 is turned off, the first capacitor C1 discharges to the first output control node OC1 and the second output control node OC2.

The output sub-circuit 130 includes a fifth transistor T5 and a sixth transistor T6. The fifth transistor T5 includes a control electrode connected to the first output control node OC1, a first electrode connected to the first clock terminal CLK1, and a second electrode connected to the first output terminal OUTPUT1. The sixth transistor T6 includes a control electrode connected to the second output control node OC2, a first electrode connected to the second clock terminal CLK2, and a second electrode connected to the second output terminal OUTPUT2.

Figure 4:
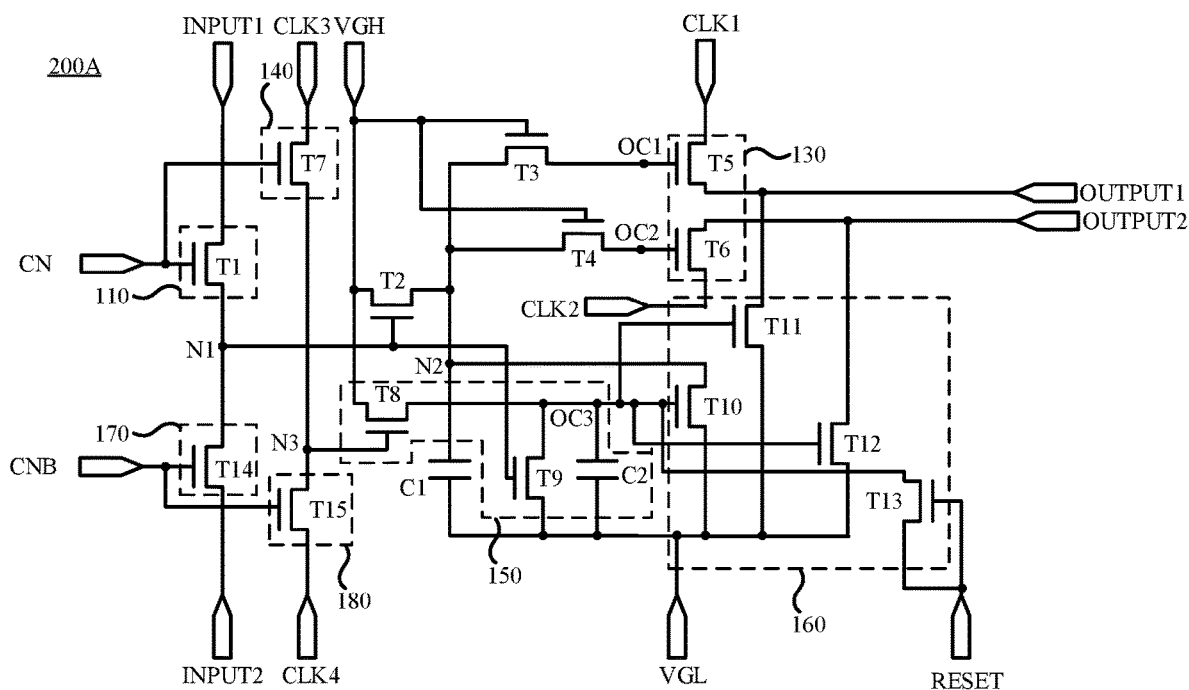
FIG. 4 is a circuit diagram of an example circuit of the shift register of FIG. 2.

FIG. 4 is a circuit diagram of an example circuit 200A of the shift register 200 of FIG. 2. For the sake of brevity, the same configuration of circuit 200A as that of circuit 100A of FIG. 3 will not be described in detail herein.

The second level control sub-circuit 140 includes a seventh transistor T7 including a control electrode connected to the first scan terminal CN, a first electrode connected to the third clock terminal CLK3, and a second electrode connected to the third node N3.

The third level control sub-circuit 150 includes an eighth transistor T8, a ninth transistor T9, and a second capacitor C2. The eighth transistor T8 includes a control electrode connected to the third node N3, a first electrode connected to the first power supply terminal VGH, and a second electrode connected to the third output control node OC3. The ninth transistor T9 includes a control electrode connected to the first node N1, a first electrode connected to the third output control node OC3, and a second electrode connected to the second power supply terminal VGL. The second capacitor C2 includes a first terminal connected to the third output control node OC3 and a second terminal connected to the second power supply terminal VGL. In the case where the eighth transistor T8 is turned on, the second capacitor C2 is charged with the first power supply voltage at the first power supply terminal VGH. In the case where the eighth transistor T8 is turned off, the second capacitor C2 discharges to the third output control node OC3.

The reset sub-circuit 160 includes a tenth transistor T10, an eleventh transistor T11, a twelfth transistor T12, and a thirteenth transistor T13. The tenth transistor T10 includes a control electrode connected to the third output control node OC3, a first electrode connected to the second node N2, and a second electrode connected to the second power supply terminal VGL. The eleventh transistor T11 includes a control electrode connected to the third output control node OC3, a first electrode connected to the first output terminal OUTPUT1, and a second electrode connected to the second power supply terminal VGL. The twelfth transistor T12 includes a control electrode connected to the third output control node OC3, a first electrode connected to the second output terminal OUTPUT2, and a second electrode connected to the second power supply terminal VGL. The thirteenth transistor T13 includes a control electrode and a first electrode connected to the reset terminal RESET and a second electrode connected to the third output control node OC3.

The second input sub-circuit 170 includes a fourteenth transistor T14 including a control electrode connected to the second scan terminal CNB, a first electrode connected to the first node N1, and a second electrode connected to the second input terminal INPUT2.

The fourth level control sub-circuit 180 includes a fifteenth transistor T15 including a control electrode connected to the second scan terminal CNB, a first electrode connected to the third node N3, and a second electrode connected to the fourth clock terminal CLK4.

Figure 5:
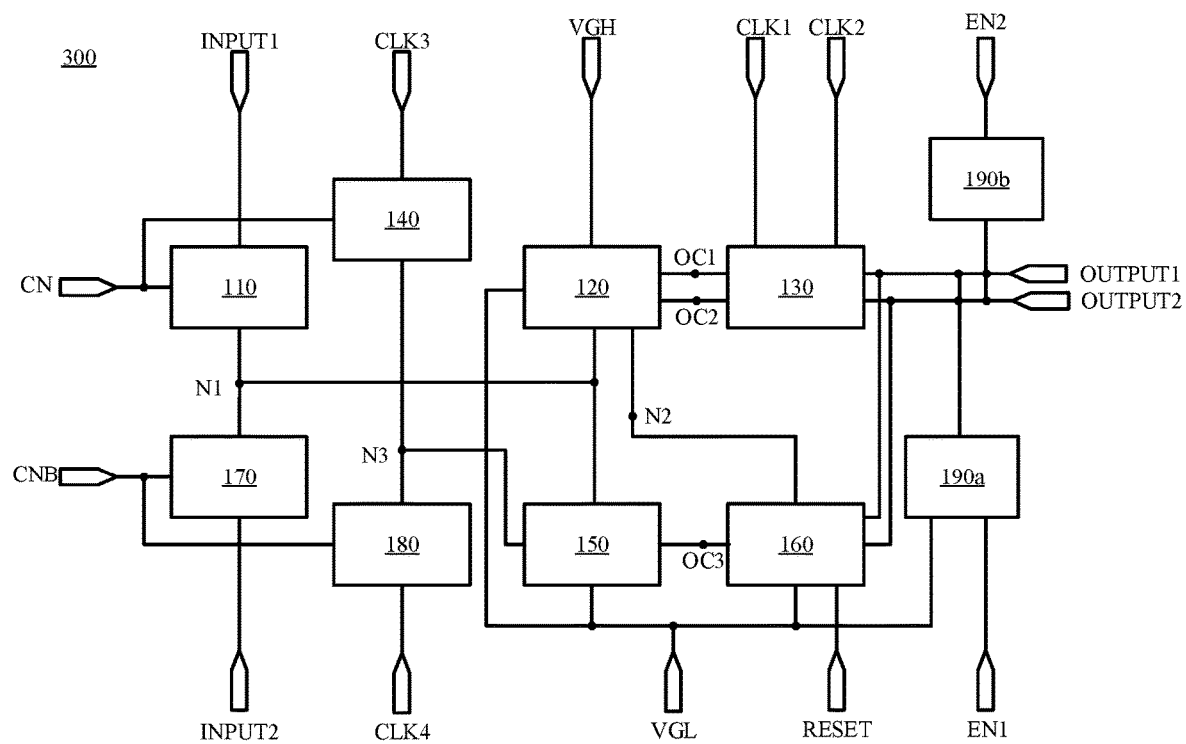
FIG. 5 is a schematic block diagram of a shift register in accordance with another embodiment of the present disclosure.

FIG. 5 is a schematic block diagram of a shift register 300 in accordance with another embodiment of the present disclosure. As shown in FIG. 5, in addition to the same configuration as that of the shift register 200 of FIG. 2, the shift register 300 further includes a touch control sub-circuit 190a and a display control sub-circuit 190b.

The touch control sub-circuit 190a is connected to a first control terminal EN1 for receiving a first control signal, the first output terminal OUTPUT1, the second output terminal OUTPUT2, and the second power supply terminal VGL. The touch control sub-circuit 190a is configured to transfer the second power supply voltage at the second power supply terminal VGL to the first output terminal OUTPUT1 and the second output terminal OUTPUT2 in response to the first control signal at the first control terminal EN1 being active. The existence of the touch control sub-circuit 190a is advantageous for touch screen applications. During a touch phase, the first control signal at the first control terminal EN1 is active such that the first output terminal OUTPUT1 and the second output terminal OUTPUT2 are supplied with the second power supply voltage at the second power supply terminal VGL. In this way, the output signals of the first output terminal OUTPUT1 and the second output terminal OUTPUT2 are pulled down to ensure that the touch operation is not affected by the display operation.

The display control sub-circuit 190b is connected to a second control terminal for receiving a second control signal EN2, the first output terminal OUTPUT1, and the second output terminal OUTPUT2. The display control sub-circuit 190b is configured to transfer the second control signal at the second control terminal EN2 to the first output terminal OUTPUT1 and the second output terminal OUTPUT2 in response to the second control signal at the second control terminal EN2 being active. The existence of the display control sub-circuit 190b is advantageous for certain application scenarios. For example, when a fault occurs in the shift register, a normal output of the shift register can be realized by supplying an active second control signal to the first output terminal OUTPUT1 and the second output terminal OUTPUT2. This allows the display panel to function properly, especially in a so-called "two lines being opened simultaneously" mode of operation (where two adjacent rows of pixels are selected simultaneously to be written with the display data).

Figure 6:
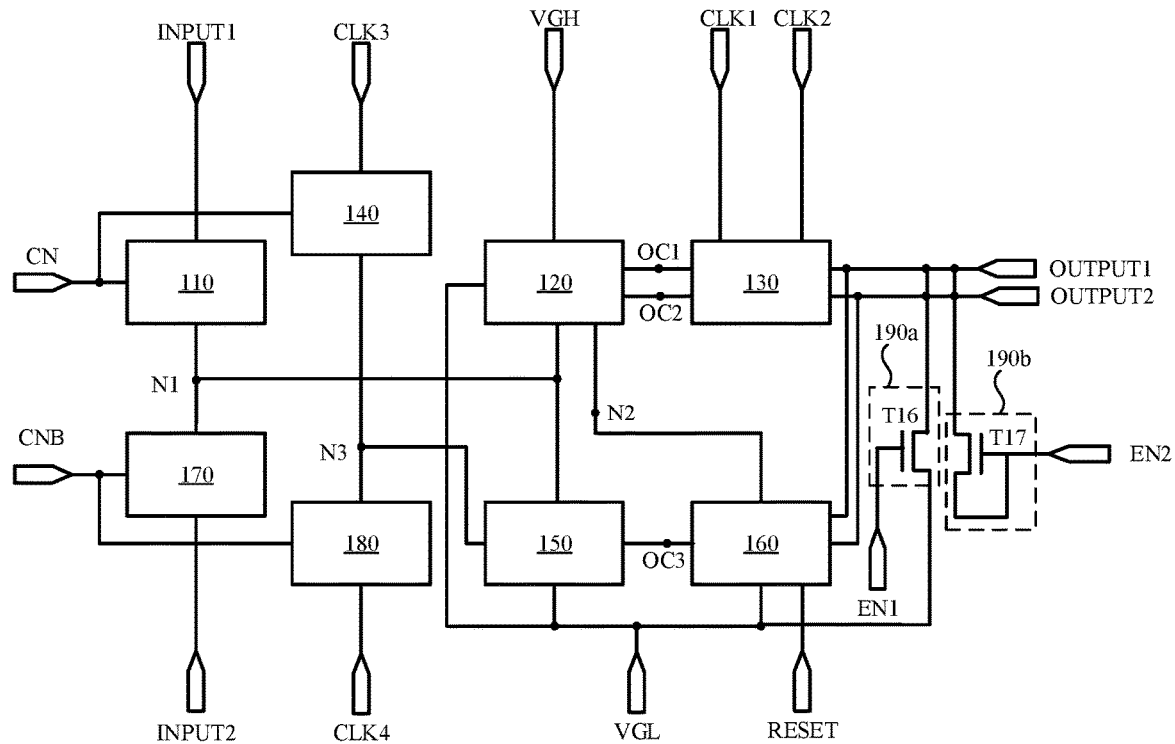
FIG. 6 is a schematic diagram showing a part of the circuit of the shift register of FIG. 5.

FIG. 6 is a schematic diagram showing a portion of the circuit of the shift register 300 of FIG. 5, in which an example circuit of the touch control sub-circuit 190a and the display control sub-circuit 190b is shown.

The touch control sub-circuit 190a includes a sixteenth transistor T16 including a control electrode connected to the first control terminal EN1, a first electrode connected to the second power supply terminal VGL, and a second electrode connected to the first output terminal OUTPUT1 and the second output terminal OUTPUT2.

The display control sub-circuit 190b includes a seventeenth transistor T17 including a control electrode and a first electrode connected to the second control terminal EN2 and a second electrode connected to the first output terminal OUTPUT1 and the second output terminal OUTPUT2.

Figure 7:
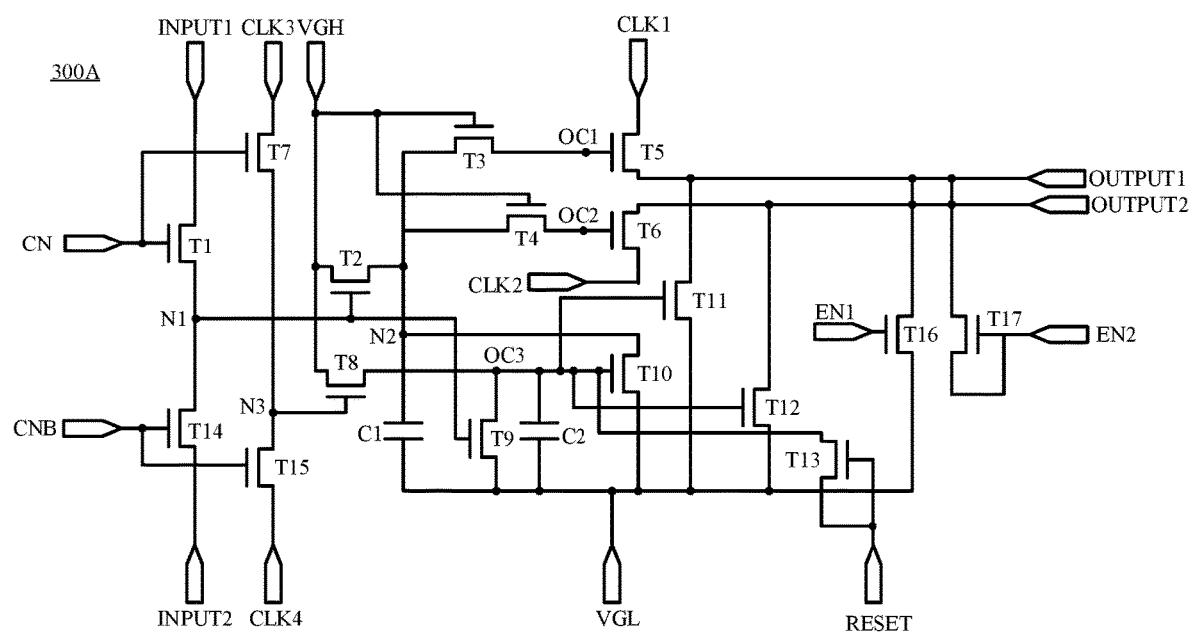
FIG. 7 is a circuit diagram of an example circuit of the shift register of FIG. 5.

FIG. 7 is a circuit diagram of an example circuit 300A of the shift register 300 of FIG. 5. The configuration of the circuit 300A is the same as that of the circuit 200A of FIG. 4 except that the circuit 300A further includes the touch control sub-circuit 190a and the display control sub-circuit 190b as shown in FIG. 6. For the sake of brevity, circuit 300A will not be described in detail herein.

Although transistors T1~T17 are illustrated and described as N-type transistors in the embodiments, P-type transistors are possible. In the case of P-type transistors, an opposite level logic should be used. In some embodiments, low temperature polysilicon thin film transistors can be used. In addition, the transistors may be of a bottom-gate structure or a top-gate structure.

The operation of the shift register 200A of FIG. 4 will be described below with reference to FIGS. 8 and 9. It is assumed that the shift register 200A operates in the forward scan mode in which the first scan terminal CN is supplied with a high level signal and the second scan terminal CNB is supplied with a low level signal. In addition, the first power supply terminal VGH is supplied with a high level voltage, and the second power supply terminal VGL is supplied with a low level voltage.

Figure 8:
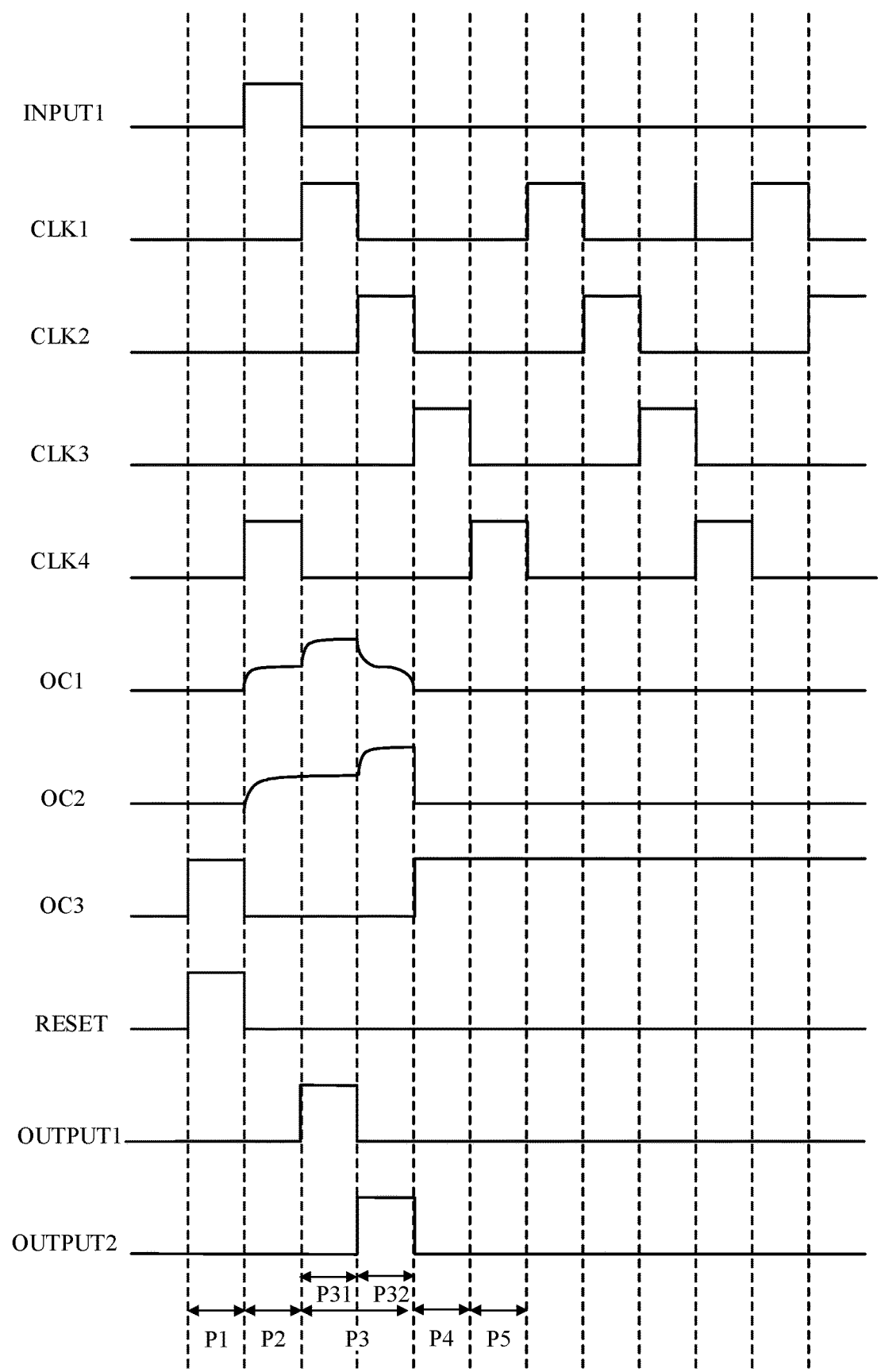
FIG. 8 is an example timing diagram of the shift register of FIG. 4.

FIG. 8 shows an example timing diagram of the shift register 200A of FIG. 4.

At a first phase P1, i.e., the initialization phase, the reset terminal RESET is at a high level, and the first input terminal INPUT1, the second input terminal INPUT2, the first scan terminal CN, the second scan terminal CNB, and the first clock terminal CLK1, the second clock terminal CLK2, the third clock terminal CLK3, and the fourth clock terminal CLK4 are at a low level. The thirteenth transistor T13 is turned on, and the potential of the third output control node OC3 is pulled high. The tenth transistor T10 is turned on to pull the potential of the second node N2 low. Since the first power supply terminal VGH is continuously supplied with a high level, the third transistor T3 and the fourth transistor T4 are turned on, so that the potentials of the first output control node OC1 and the second output control node OC2 are also pulled down to a low level. The eleventh transistor T11 is turned on to pull the potential of the first output terminal OUTPUT1 to a low level of the second power supply voltage of the second power supply terminal VGL. The twelfth transistor T12 is turned on to pull the potential of the second output terminal OUTPUT2 to a low level of the second power supply voltage of the second power supply terminal VGL.

At a second phase P2, i.e., the input phase, the first input terminal INPUT1, the first scan terminal CN, and the fourth clock terminal CLK4 are at a high level, and the second input terminal INPUT2, the second scan terminal CNB, the reset terminal RESET, and the first clock terminal CLK1, the second clock terminal CLK2, and the third clock terminal CLK3 are at a low level. The first transistor T1 is turned on to pull the potential of the first node N1 to the potential at the first input terminal INPUT1. Since the first node N1 is at a high level, the second transistor T2 and the ninth transistor T9 are turned on. The turned-on second transistor T2 pulls the potential of the second node N2 high to a high level of the first power supply voltage at the first power supply terminal VGH. At this time, the first capacitor C1 is charged. Since the first power supply terminal VGH is continuously supplied with a high level, the third transistor T3 and the fourth transistor T4 are turned on, and the potentials of the first output control node OC1 and the second output control node OC2 are pulled up to the high level of the second node N2. Since the first clock terminal CLK1 and the second clock terminal CLK2 are at a low level, the output signals of the first output terminal OUTPUT1 and the second output terminal OUTPUT2 are both low. The ninth transistor T9 is turned on to pull the potential of the third output control node OC3 to a low level of the second power supply voltage of the second power supply terminal VGL. Although the first scan terminal CN is at a high level and the seventh transistor T7 is turned on, in this phase the potential of the third node N3 is not pulled high and the eighth transistor T8 is not turned on because the third clock terminal CLK3 is at a low level. Since the potential of the third output control node OC3 is pulled low, the tenth transistor T10, the eleventh transistor T11, and the twelfth transistor T12 are not turned on.

A third phase P3, i.e., the output phase, includes a first output phase P31 and a second output phase P32.

At the first output phase P31, the first scan terminal CN and the first clock terminal CLK1 are at a high level, and the first input terminal INPUT1, the second input terminal INPUT2, the second scan terminal CNB, the reset terminal RESET, and the second clock terminal CLK2, the third clock terminal CLK3, and the fourth clock terminal CLK4 are at a low level. The first transistor T1 and the second transistor T2 are turned off. At this time, the first capacitor C1 starts to discharge, so that the potentials of the first output control node OC1 and the second output control node OC2 are not lowered, and the fifth transistor T5 and the sixth transistor T6 are turned on. The fifth transistor T5 has a bootstrap effect by designing the width-to-length ratio of the channel of the fifth transistor T5. Since the first clock signal at the first clock terminal CLK1 transitions from a low level to a high level, the potential of the first output control node OC1 continues to be pulled high under the bootstrap effect of the fifth transistor T5, and the first output terminal OUTPUT1 outputs the first clock signal at the first clock terminal CLK1. The increase of the potential at the first output control node OC1 ensures the conduction of the fifth transistor T5, improving the pixel charging capability.

At the second output phase P32, the first scan terminal CN and the second clock terminal CLK2 are at a high level, and the first input terminal INPUT1, the second input terminal INPUT2, the second scan terminal CNB, the reset terminal RESET, and the first clock terminal CLK1, the third clock terminal CLK3, and the fourth clock terminal CLK4 are at a low level. The discharge of the first capacitor C1 is completed, and the potential of the first output control node OC1 starts to decrease gradually. The sixth transistor T6 has a bootstrap effect by designing the width-to-length ratio of the channel of the sixth transistor T6. Since the second clock signal at the second clock terminal CLK2 transitions from a low level to a high level, the potential of the second output control node OC2 continues to be pulled high by the bootstrap effect of the sixth transistor T6, and the output terminal OUTPUT2 outputs the second clock signal at the second clock terminal CLK1. The increase of the potential of the second output control node OC2 ensures the conduction of the sixth transistor T6, improving the pixel charging capability.

At the fourth phase P4, the first scan terminal CN and the third clock terminal CLK3 are at a high level, and the first input terminal INPUT1, the second input terminal INPUT2, the second scan terminal CNB, the reset terminal RESET, and the first clock terminal CLK1, the third clock terminal CLK3, and the fourth clock terminal CLK4 are at a low level. The seventh transistor T7 is turned on, and the third clock terminal CLK3 is at a high level, so that the potential of the third node N3 is pulled high. The eighth transistor T8 is turned on, and the potential of the third output control node OC3 is pulled up to a high level of the first power supply voltage at the first power supply terminal VGH. At this time, the second capacitor C2 is charged, and the tenth transistor T10 is turned on, pulling the potential of the second node N2 down to a low level of the second power supply voltage at the second power supply terminal VGL. The potentials of the first output control node OC1 and the second output control node OC2 are also pulled down to a low level. The eleventh transistor T11 is turned on to pull the output signal of the first output terminal OUTPUT1 to a low level of the second power supply voltage at the second power supply terminal VGL. The twelfth transistor T12 is turned on to pull the output signal of the second output terminal OUTPUT2 to a low level of the second power supply voltage at the second power supply terminal VGL.

At a fifth phase P5, the first scan terminal CN and the fourth clock terminal CLK4 are at a high level, and the first input terminal INPUT1, the second input terminal INPUT2, the second scan terminal CNB, the reset terminal RESET, and the first clock terminal CLK1, the second clock terminal CLK2, and the third clock terminal CLK3 are at a low level. The third clock terminal CLK3 is at a low level, and the eighth transistor T8 is turned off. The second capacitor C2 is discharged such that the potential of the third output control node OC3 is maintained at a high level. The tenth transistor T10 is turned on to pull the potential of the second node N2 down to a low level of the second power supply voltage at the second power supply terminal VGL. The potentials of the first output control node OC1 and the second output control node OC2 are also pulled down to a low level. The eleventh transistor T11 is turned on to pull the output signal of the first output terminal OUTPUT1 to a low level of the second power supply voltage at the second power supply terminal VGL. The twelfth transistor T12 is turned on to pull the output signal of the second output terminal OUTPUT2 to a low level of the second power supply voltage at the second power supply terminal VGL. Since the second scan terminal CNB is at a low level, the fifteenth transistor T15 is turned off, and the potential of the second node N2 is not pulled high.

The fourth phase P4, the fifth phase P5, and subsequent phases may be referred to as a hold phase in which the first output signal and the second output signal of the shift register remain inactive. When the active input signal is received again at the first input terminal INPUT1 (in the forward scan mode) or the second input terminal INPUT2 (in the reverse scan mode), the next cycle is entered.

The reverse scan mode is similar to the forward scan mode described above except that the second scan terminal CNB is continuously supplied with a high level, the first scan terminal CN is continuously supplied with a low level, and the input signal is supplied to the second input terminal INPUT2 instead of the first input INPUT1. For the sake of brevity, the operation of the shift register 200A in the reverse scan mode will not be described in detail herein.

Figure 9:
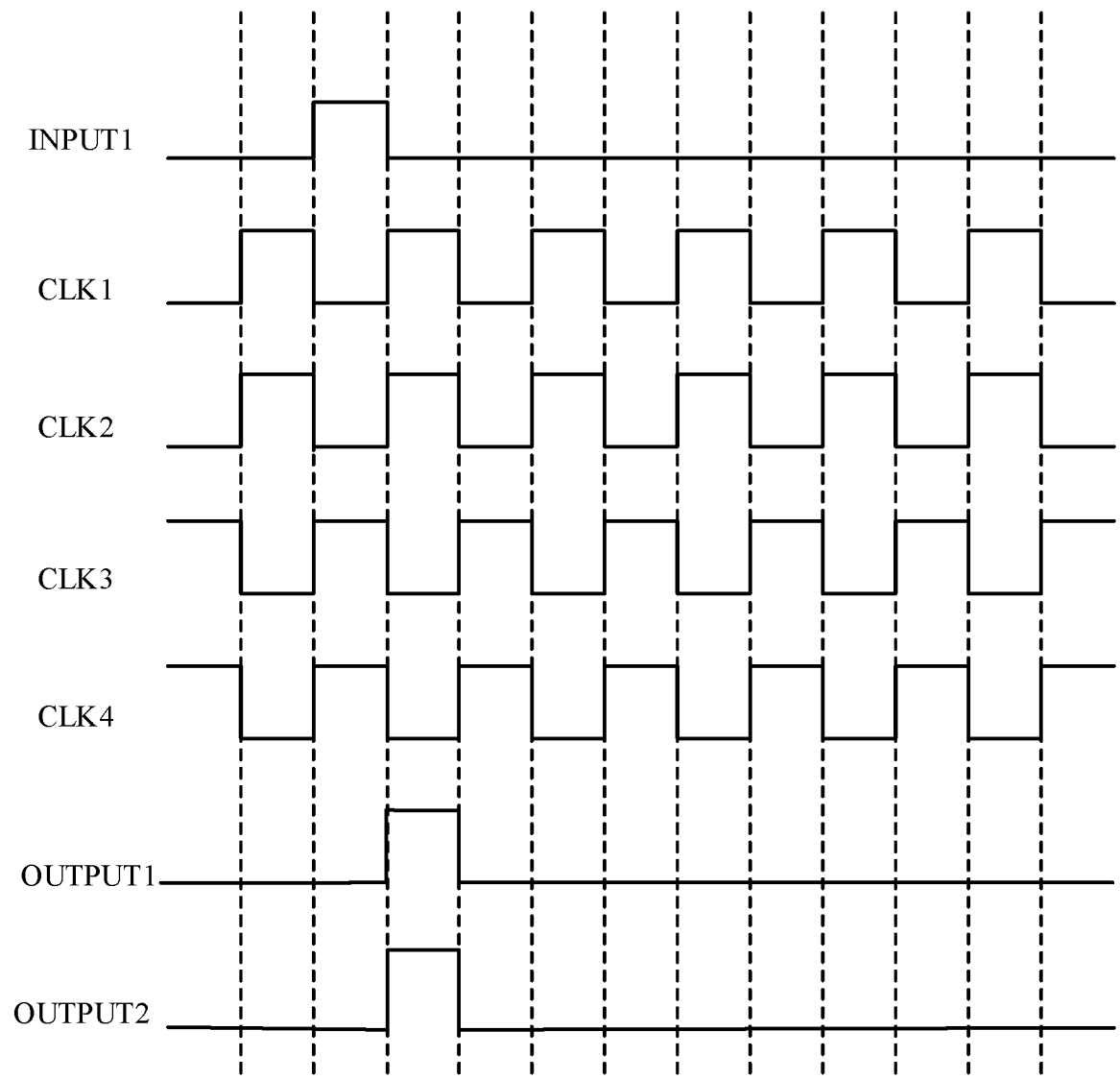
FIG. 9 is another example timing diagram of the shift register of FIG. 4.

FIG. 9 is another example timing diagram of the shift register 200A of FIG. 4. In this example, the first clock terminal CLK1 and the second clock terminal CLK2 are supplied with the same clock signal, and the third clock terminal CLK3 and the fourth clock terminal CLK4 are supplied with the same clock signal, which is opposite in phase to the clock signal supplied to the first clock terminal CLK1 and the second clock terminal CLK2. Thereby, synchronized output signals are obtained at the first output terminal OUTPUT1 and the second output terminal OUTPUT2 of the shift register 200A. This timing can be applied to the so-called "two lines being opened simultaneously" mode of operation of the display panel, in which two adjacent rows of pixels are selected simultaneously to be written with the display data.

Figure 10:
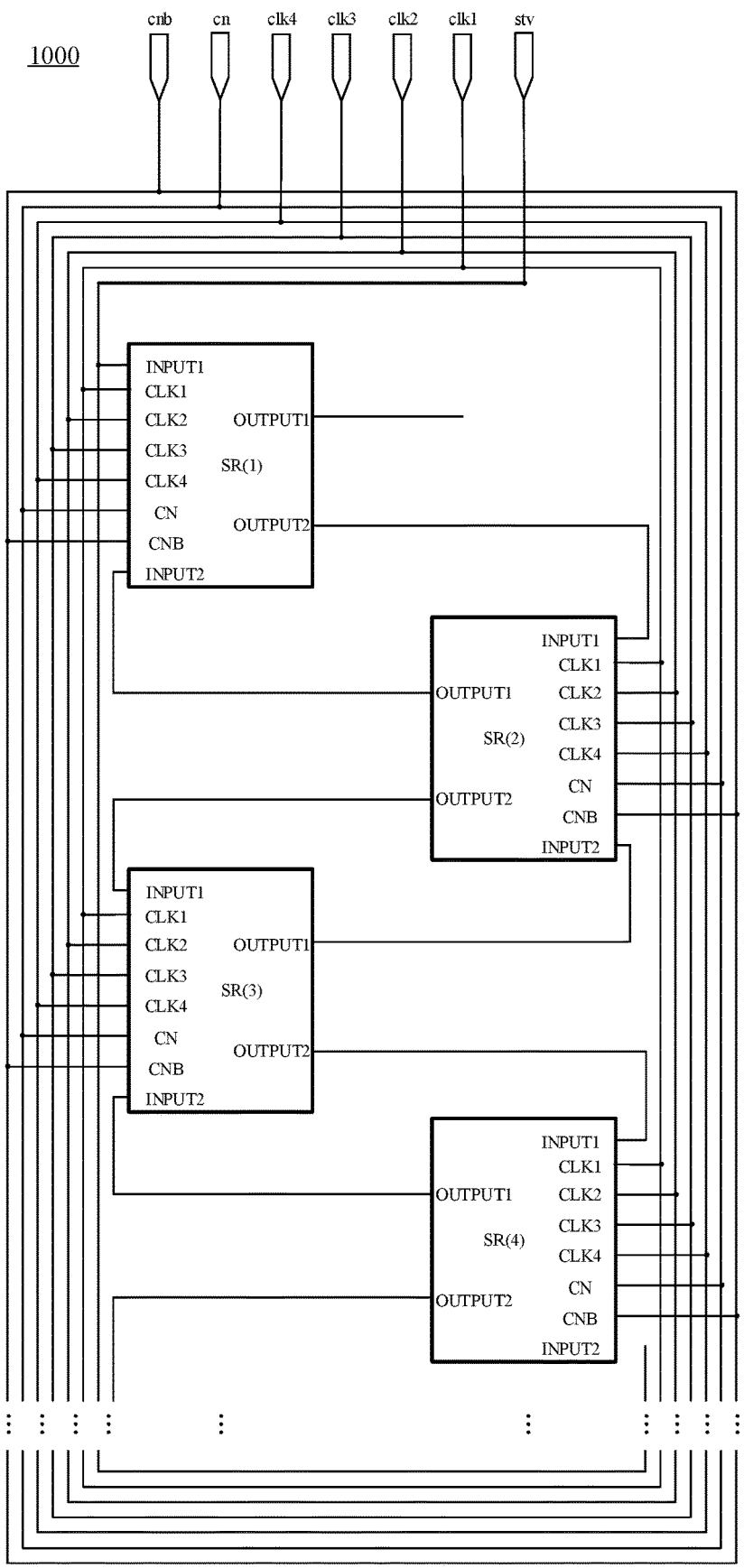
FIG. 10 is a schematic block diagram of a gate driving circuit in accordance with an embodiment of the present disclosure.

FIG. 10 is a schematic block diagram of a gate driving circuit 1000 in accordance with an embodiment of the present disclosure. The gate driving circuit 1000 includes N cascaded shift registers (N being a positive integer and N≥4), four of which (i.e., SR(1), SR(2), SR(3), and SR(4)) are shown in FIG. 10.

In this example, the first input terminal INPUT1 of the first shift register SR(1) is configured to receive a start signal sty, that is, the gate driving circuit 1000 operates in the forward scan mode.

The second output terminal OUTPUT2 of the k-th one of the N shift registers is connected to the first input terminal INPUT1 of the (k+1)-th one of the N shift registers, k being a positive integer and 1≤k<N. For example, the second output terminal OUTPUT2 of the 3rd shift register SR(3) is connected to the first input terminal INPUT1 of the 4th shift register SR(4).

The first output terminal OUTPUT1 of the (k+1)-th shift register is connected to the second input terminal INPUT2 of the k-th shift register. For example, the first output terminal OUTPUT1 of the 4th shift register SR(4) is connected to the second input terminal INPUT2 of the 3rd shift register SR(3).

As shown in FIG. 10, the first clock terminals CLK1 of the N shift registers are configured to receive the same first clock signal clk1, and the second clock terminals of the N shift registers CLK2 are configured to receive the same second clock signal clk2, the third clock terminals CLK3 of the N shift registers being configured to receive the same third clock signal clk3, and the fourth clock terminals CLK4 of the N shift registers are configured to receive the same fourth clock signal clk4. With such a configuration, the gate driving circuit 1000 requires only four clock signals. This further saves the wiring space and facilitates a narrow bezel design as compared to a solution that requires more clock signals (e.g., eight clocks).

Figure 11:
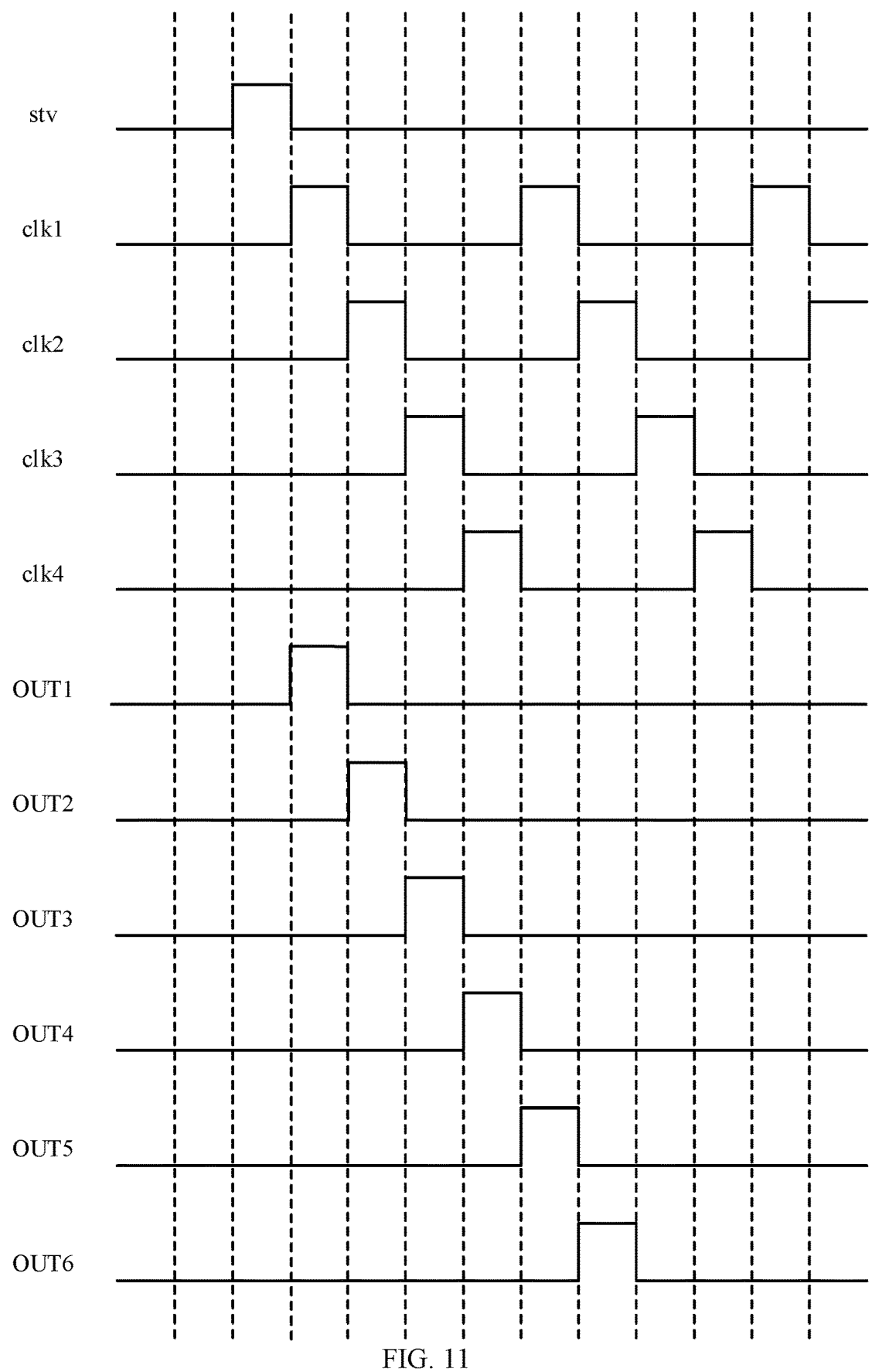
FIG. 11 is an example timing diagram of the gate driving circuit of FIG. 10.

FIG. 11 is an example timing diagram of the gate driving circuit 1000 of FIG. 10. In this example, the gate driving circuit 1000 operates in the forward scan mode. As shown in FIG. 11, under the driving of the start signal sty and the clock signals clk1, clk2, clk3, and clk4, the shift registers of the gate driving circuit 1000 sequentially output gate scan pulses from top to bottom, six of which (i.e., OUT1, OUT2, OUT3, OUT4, OUT5, OUT6) are shown in FIG. 11.

Figure 12:
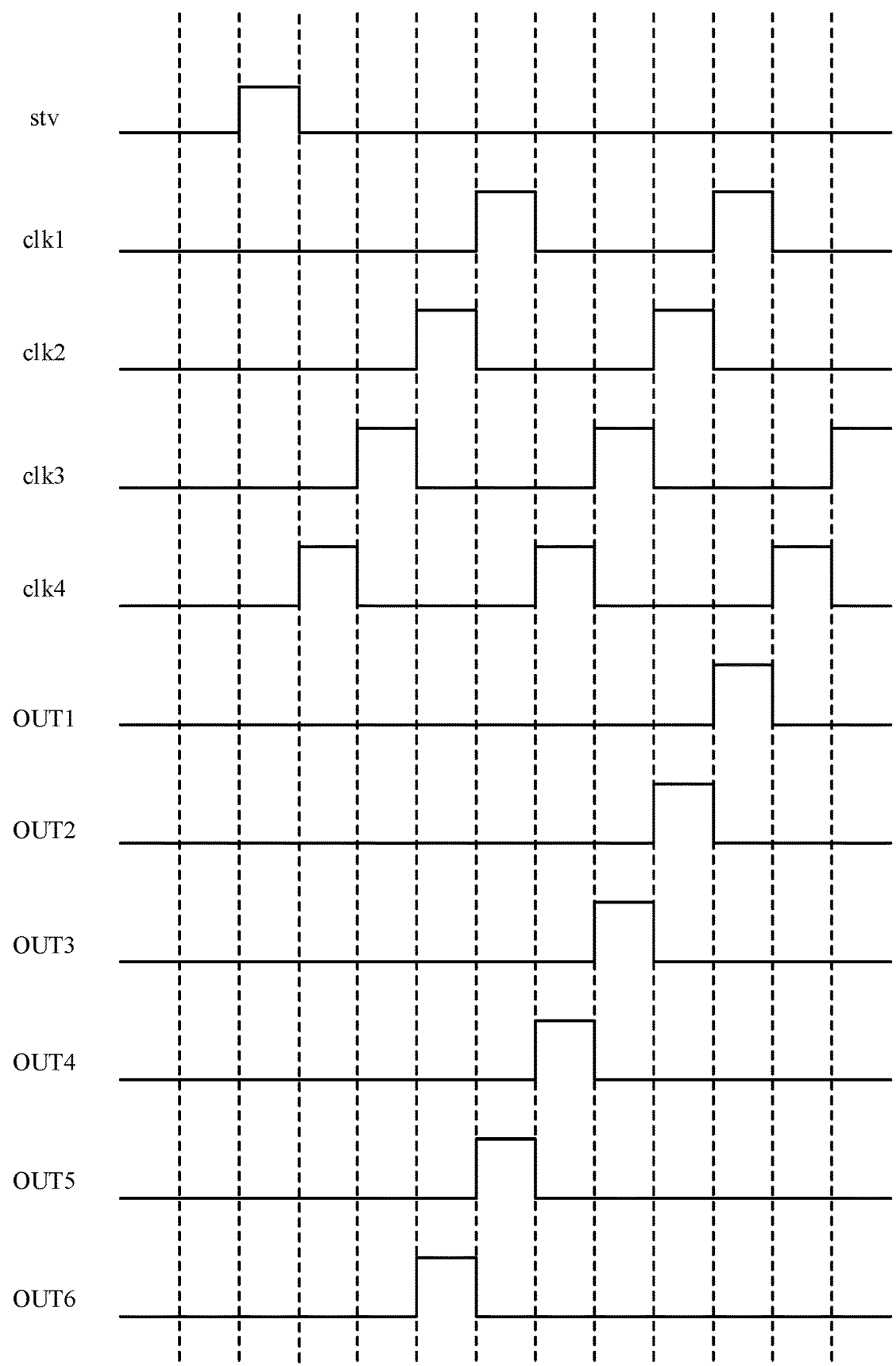
FIG. 12 is another example timing diagram of the gate driving circuit of FIG. 10.

FIG. 12 is another example timing diagram of the gate driving circuit 1000 of FIG. 10. In this example, the gate driving circuit 1000 operates in the reverse scan mode. As shown in FIG. 12, under the driving of the start signal sty and the clock signals clk1, clk2, clk3, and clk4, the shift registers of the gate driving circuit 1000 sequentially output gate scan pulses from bottom to top, six of which (i.e., OUT1, OUT2, OUT3, OUT4, OUT5, OUT6) are shown in FIG. 12.

Figure 13:
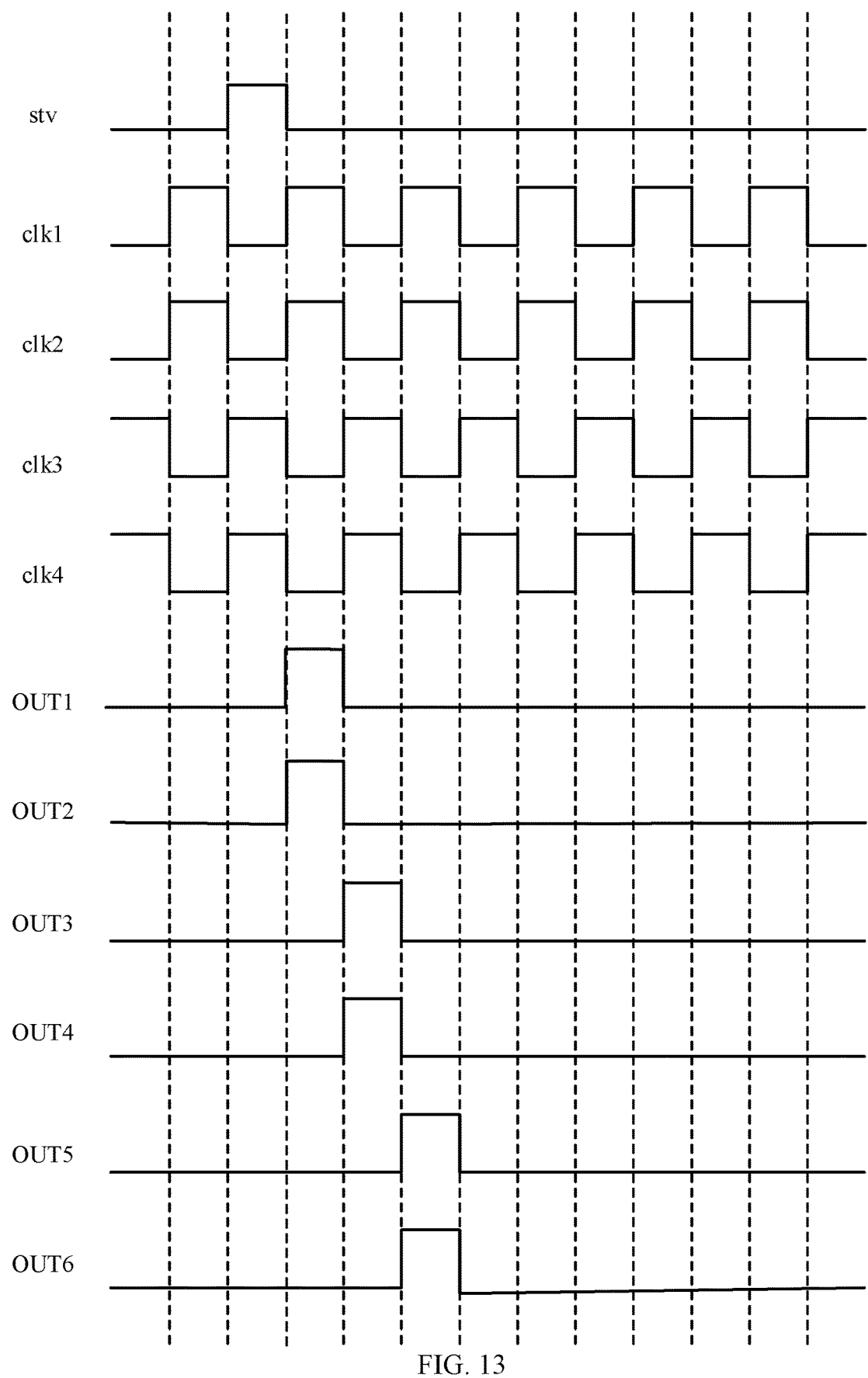
FIG. 13 is another example timing diagram of the gate driving circuit of FIG. 10.

FIG. 13 is another example timing diagram of the gate driving circuit 1000 of FIG. 10. In this example, the gate driving circuit 1000 operates in the forward scan mode (and specifically, the "two lines being opened simultaneously" mode of the display panel). As shown in FIG. 13, under the driving of the start signal sty and the clock signals clk1, clk2, clk3, and clk4, the shift registers of the gate driving circuit 1000 sequentially output gate scan pulses from top to bottom, six of which (i.e., OUT1, OUT2, OUT3, OUT4, OUT5, OUT6) are shown in FIG. 13. The two output signals (e.g., OUT1/OUT2, OUT3/OUT4, or OUT5/OUT6) of each of the shift registers have the same timing.

Figure 14:
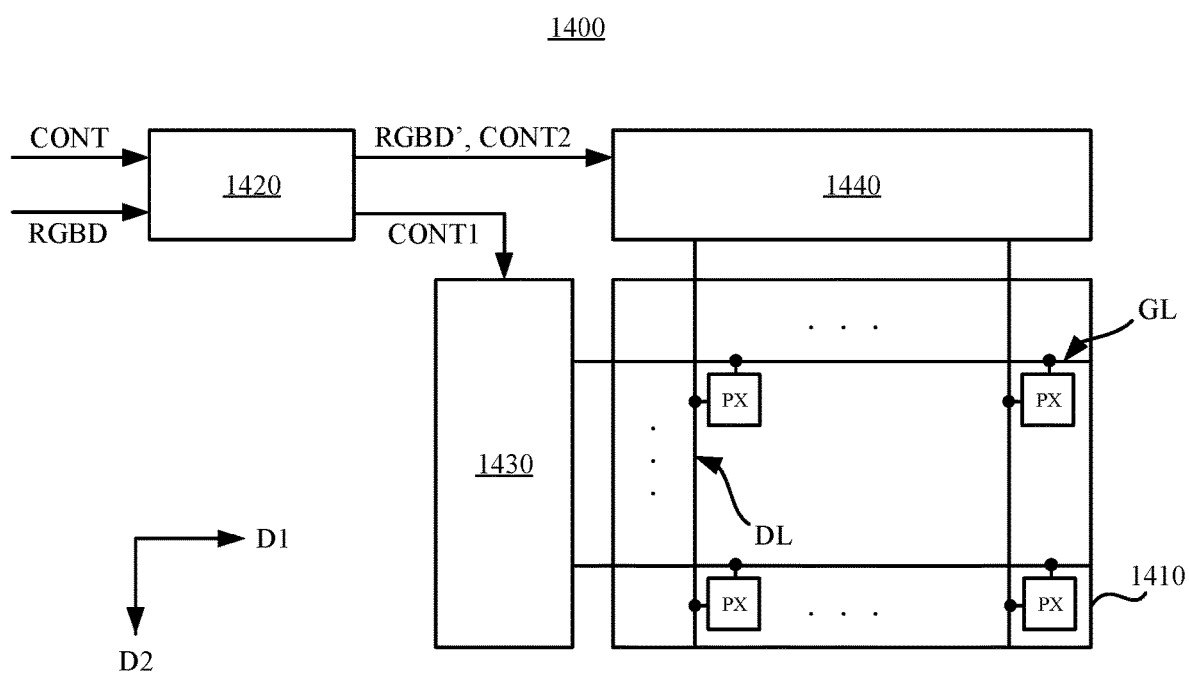
FIG. 14 is a schematic block diagram of a display device in accordance with an embodiment of the present disclosure.

FIG. 14 is a schematic block diagram of a display device 1400 in accordance with an embodiment of the present disclosure.

Referring to FIG. 14, the display device 1400 includes a pixel array 1410, a timing controller 1420, a gate driver 1430, and a data driver 1440.

The pixel array 1410 is connected to a plurality of gate lines GL and a plurality of data lines DL. The gate lines GL extend in a first direction D1, and the data lines DL extend in a second direction D2 that intersects (e.g., is substantially perpendicular to) the first direction D1. The pixel array 1410 includes a plurality of pixels PX arranged in a matrix. Each of the pixels PX is electrically connected to a corresponding one of the gate lines GL and a corresponding one of the data lines DL.

The timing controller 1420 controls the operation of the pixel array 1410, the gate driver 1430, and the data driver 1440. The timing controller 1420 receives input image data RGBD and an input control signal CONT from a system interface. The input image data RGBD includes a plurality of input pixel data for the plurality of pixels. Each of the input pixel data may include red gradation data R, green gradation data and blue gradation data B for a corresponding one of the plurality of pixels. The input control signal CONT may include a main clock signal, a data enable signal, a vertical sync signal, a horizontal sync signal, etc. The timing controller 1420 generates output image data RGBD', a first control signal CONT1, and a second control signal CONT2 based on the input image data RGBD and the input control signal CONT. For example, the timing controller 1420 can generate output image data RGBD' from the input image data RGBD. The output image data RGBD' can be supplied to the data driver 1440. In some embodiments, the output image data RGBD' may be substantially the same as the input image data RGBD. In some embodiments, the output image data RGBD' may be compensated image data generated by compensating the input image data RGBD. The output image data RGBD' may include a plurality of output pixel data for the plurality of pixels. The timing controller 1420 can generate the first control signal CONT1 based on the input control signal CONT. The first control signal CONT1 may be supplied to the gate driver 1430, and the driving timing of the gate driver 1430 may be controlled based on the first control signal CONT1. The first control signal CONT1 may include a vertical enable signal, a gate clock signal, etc. The timing controller 1420 can generate the second control signal CONT2 based on the input control signal CONT. The second control signal CONT2 may be supplied to the data driver 1440, and the driving timing of the data driver 1440 may be controlled based on the second control signal CONT2. The second control signal CONT2 may include a horizontal enable signal, a data clock signal, a data load signal, a polarity control signal, etc.

The gate driver 1430 receives the first control signal CONT1 from the timing controller 1420. The gate driver 1430 generates a plurality of gate signals for driving the gate lines GL based on the first control signal CONT1. The gate driver 1430 can sequentially apply a plurality of gate signals to the gate lines GL. The gate driver 1430 can take the form of the gate driving circuit 1000 as described above with respect to FIG. 10. In exemplary embodiments, the first control signal CONT1 generated by the timing controller 1420 and provided to the gate driver 1420 may include the first, second, third and fourth clock signals clk1, clk2, clk3 and clk4.

The data driver 1440 receives the second control signal CONT2 and the output image data RGBD' from the timing controller 1420. The data driver 1440 generates a plurality of data voltages based on the second control signal CONT2 and the output image data RGBD'. The data driver 1440 can apply the plurality of data voltages to the data lines DL. In some exemplary embodiments, data driver 1440 may include a shift register, a latch, a digital-to-analog converter, and a buffer. The shift register can output a latch pulse to the latch. The latch can temporarily store the output image data RGBD', and can output the output image data RGBD' to the digital-to-analog converter. The digital-to-analog converter can generate analog data voltages based on the output image data RGBD', and can output the analog data voltages to the buffer. The buffer can output the analog data voltages to the data lines DL.

In some exemplary embodiments, the gate driver 1430 can be integrated with the pixel array 1410, in which case the gate driver 1430 can be referred to as a GOA circuit. Alternatively, the gate driver 1430 can be connected to the pixel array 1410 via a Tape Carrier Package (TCP).

Variations to the disclosed embodiments can be understood and effected by the skilled person in practicing the claimed subject matter, from a study of the drawings, the disclosure, and the appended claims. In the claims, the indefinite article "a" or "an" does not exclude a plurality. The mere fact that certain measures are recited in mutually different dependent claims does not indicate that a combination of these measures cannot be used to advantage.

What is claimed is:

1. A shift register, comprising:
   a first scan terminal configured to receive a first scan signal;
   a first input terminal configured to receive a first input signal;
   a first power supply terminal configured to receive a first power supply voltage;
   a second power supply terminal configured to receive a second power supply voltage;
   a first clock terminal configured to receive a first clock signal;
   a second clock terminal configured to receive a second clock signal;
   a first output terminal configured to output a first output signal;
   a second output terminal configured to output a second output signal;
   a first input sub-circuit configured to transfer the first input signal at the first input terminal to a first node in response to the first scan signal at the first scan terminal being active;
   a first level control sub-circuit configured to transfer the first power supply voltage at the first power supply terminal to a first output control node and a second output control node in response to the first node being at an active potential; and
   an output sub-circuit configured to transfer the first clock signal at the first clock terminal to the first output terminal as the first output signal in response to the first output control node being at an active potential, and configured to transfer the second clock signal at the second clock terminal to the second output terminal as the second output signal in response to the second output control node being at an active potential.

2. The shift register of claim 1, further comprising:
   a third clock terminal configured to receive a third clock signal;
   a reset terminal configured to receive a reset signal;
   a second level control sub-circuit configured to transfer the third clock signal at the third clock terminal to a third node in response to the first scan signal at the first scan terminal being active;
   a third level control sub-circuit configured to transfer the first power supply voltage at the first power supply terminal to a third output control node in response to the third node being at an active potential, and configured to transfer the second power supply voltage at the second power supply terminal to the third output control node in response to the first node being at an active potential; and
   a reset sub-circuit configured to transfer the reset signal at the reset terminal to the third output control node in response to the reset signal at the reset terminal being active, and configured to transfer the second power supply voltage at the second power supply terminal to a second node, the first output terminal, and the second output terminal in response to the third output control node being at an active potential.

3. The shift register of claim 2, further comprising:
   a second scan terminal configured to receive a second scan signal;
   a second input terminal configured to receive a second input signal;
   a fourth clock terminal configured to receive a fourth clock signal;
   a second input sub-circuit configured to transfer the second input signal at the second input terminal to the first node in response to the second scan signal at the second scan terminal being active; and
   a fourth level control sub-circuit configured to transfer the fourth clock signal at the fourth clock terminal to the third node in response to the second scan signal at the second scan terminal being active.

4. The shift register of claim 1,
   wherein the first input sub-circuit comprises a first transistor comprising a control electrode connected to the first scan terminal, a first electrode connected to the first input terminal, and a second electrode connected to the first node,
   wherein the first level control sub-circuit comprises:
   a second transistor comprising a control electrode connected to the first node, a first electrode connected to the first power supply terminal, and a second electrode connected to a second node;
   a third transistor comprising a control electrode connected to the first power supply terminal, a first electrode connected to the second node, and a second electrode connected to the first output control node;
   a fourth transistor comprising a control electrode connected to the first power supply terminal, a first electrode connected to the second node, and a second electrode connected to the second output control node;
   a first capacitor comprising a first terminal connected to the second node and a second terminal connected to the second power supply terminal, and
   wherein the output sub-circuit comprises:
   a fifth transistor comprising a control electrode connected to the first output control node, a first electrode connected to the first clock terminal, and a second electrode connected to the first output terminal; and
   a sixth transistor comprising a control electrode connected to the second output control node, a first electrode connected to the second clock terminal, and a second electrode connected to the second output terminal.

5. The shift register of claim 2,
wherein the second level control sub-circuit comprises a seventh transistor comprising a control electrode connected to the first scan terminal, a first electrode connected to the third clock terminal, and a second electrode connected to the third node,
wherein the third level control sub-circuit comprises:
an eighth transistor comprising a control electrode connected to the third node, a first electrode connected to the first power supply terminal, and a second electrode connected to the third output control node;
a ninth transistor comprising a control electrode connected to the first node, a first electrode connected to the third output control node, and a second electrode connected to the second power supply terminal; and
a second capacitor comprising a first terminal connected to the third output control node and a second terminal connected to the second power supply terminal, and
wherein the reset sub-circuit comprises:
a tenth transistor comprising a control electrode connected to the third output control node, a first electrode connected to the second node, and a second electrode connected to the second power supply terminal;
an eleventh transistor comprising a control electrode connected to the third output control node, a first electrode connected to the first output terminal, and a second electrode connected to the second power supply terminal;
a twelfth transistor comprising a control electrode connected to the third output control node, a first electrode connected to the second output terminal, and a second electrode connected to the second power supply terminal; and
a thirteenth transistor comprising a control electrode connected to the reset terminal, a first electrode connected to the reset terminal, and a second electrode connected to the third output control node.

6. The shift register of claim 3,
wherein the second input sub-circuit comprises a fourteenth transistor comprising a control electrode connected to the second scan terminal, a first electrode connected to the first node, and a second electrode connected to the second input terminal, and
wherein the fourth level control sub-circuit comprises a fifteenth transistor comprising a control electrode connected to the second scan terminal, a first electrode connected to the third node, and a second electrode connected to the fourth clock terminal.

7. The shift register of claim 3, further comprising:
a first control terminal configured to receive a first control signal;
a second control terminal configured to receive a second control signal;
a touch control sub-circuit configured to transfer the second power supply voltage at the second power supply terminal to the first output terminal and the second output terminal in response to the first control signal at the first control terminal being active; and
a display control sub-circuit configured to transfer the second control signal at the second control terminal to the first output terminal and the second output terminal in response to the second control signal at the second control terminal being active.

8. The shift register of claim 7,
wherein the touch control sub-circuit comprises a sixteenth transistor comprising a control electrode connected to the first control terminal, a first electrode connected to the second power supply terminal, and a second electrode connected to the first output terminal and the second output terminal; and
wherein the display control sub-circuit comprises a seventeenth transistor comprising a control electrode connected to the second control terminal, a first electrode connected to the second control terminal, and a second electrode connected to the first output terminal and the second output terminal.

9. The shift register of claim 8,
wherein the first input sub-circuit comprises a first transistor comprising a control electrode connected to the first scan terminal, a first electrode connected to the first input terminal, and a second electrode connected to the first node,
wherein the first level control sub-circuit comprises:
a second transistor comprising a control electrode connected to the first node, a first electrode connected to the first power supply terminal, and a second electrode connected to the second node;
a third transistor comprising a control electrode connected to the first power supply terminal, a first electrode connected to the second node, and a second electrode connected to the first output control node;
a fourth transistor comprising a control electrode connected to the first power supply terminal, a first electrode connected to the second node, and a second electrode connected to the second output control node; and
a first capacitor comprising a first terminal connected to the second node and a second terminal connected to the second power supply terminal,
wherein the output sub-circuit comprises:
a fifth transistor comprising a control electrode connected to the first output control node, a first electrode connected to the first clock terminal, and a second electrode connected to the first output terminal; and
a sixth transistor comprising a control electrode connected to the second output control node, a first electrode connected to the second clock terminal, and a second electrode connected to the second output terminal,
wherein the second level control sub-circuit comprises a seventh transistor comprising a control electrode connected to the first scan terminal, a first electrode connected to the third clock terminal, and a second electrode connected to the third node,
wherein the third level control sub-circuit comprises:
an eighth transistor comprising a control electrode connected to the third node, a first electrode connected to the first power supply terminal, and a second electrode connected to the third output control node;
a ninth transistor comprising a control electrode connected to the first node, a first electrode connected to the third output control node, and a second electrode connected to the second power supply terminal; and
a second capacitor comprising a first terminal connected to the third output control node and a second terminal connected to the second power supply terminal,
wherein the reset sub-circuit comprises:
a tenth transistor comprising a control electrode connected to the third output control node, a first electrode connected to the second node, and a second electrode connected to the second power supply terminal;
an eleventh transistor comprising a control electrode connected to the third output control node, a first electrode connected to the first output terminal, and a second electrode connected to the second power supply terminal;

a twelfth transistor comprising a control electrode connected to the third output control node, a first electrode connected to the second output terminal, and a second electrode connected to the second power supply terminal; and a thirteenth transistor comprising a control electrode connected to the reset terminal, a first electrode connected to the reset terminal, and a second electrode connected to the third output control node, wherein the second input sub-circuit comprises a fourteenth transistor comprising a control electrode connected to the second scan terminal, a first electrode connected to the first node, and a second electrode connected to the second input terminal, and wherein the fourth level control sub-circuit comprises a fifteenth transistor comprising a control electrode connected to the second scan terminal, a first electrode connected to the third node, and a second electrode connected to the fourth clock terminal.

10. A gate driving circuit, comprising:

N cascaded shift registers of claim 3, wherein N is a positive integer and N≥4, wherein the first input terminal of a first one of the N cascaded shift registers or the second input terminal of an N-th one of the N cascaded shift registers is configured to receive a start signal, wherein the second output terminal of a k-th one of the N cascaded shift registers is connected to the first input terminal of a (k+1)-th one of the N cascaded shift registers, k being a positive integer and 1≤k≤N, and wherein the first output terminal of the (k+1)-th shift register is connected to the second input terminal of the k-th shift register.

11. The gate driving circuit of claim 10, wherein the first clock terminals of the N cascaded shift registers are configured to receive a same first clock signal, wherein the second clock terminals of the N cascaded shift registers are configured to receive a same second clock signal, wherein the third clock terminals of the N cascaded shift registers are configured to receive a same third clock signal, and wherein the fourth clock terminals of the N cascaded shift registers are configured to receive a same fourth clock signal.

12. The gate driving circuit of claim 10, wherein the first input sub-circuit comprises a first transistor comprising a control electrode connected to the first scan terminal, a first electrode connected to the first input terminal, and a second electrode connected to the first node, wherein the first level control sub-circuit comprises:

a second transistor comprising a control electrode connected to the first node, a first electrode connected to the first power supply terminal, and a second electrode connected to the second node;

a third transistor comprising a control electrode connected to the first power supply terminal, a first electrode connected to the second node, and a second electrode connected to the first output control node;

a fourth transistor comprising a control electrode connected to the first power supply terminal, a first electrode connected to the second node, and a second electrode connected to the second output control node;

a first capacitor comprising a first terminal connected to the second node and a second terminal connected to the second power supply terminal, and wherein the output sub-circuit comprises:

a fifth transistor comprising a control electrode connected to the first output control node, a first electrode connected to the first clock terminal, and a second electrode connected to the first output terminal; and a sixth transistor comprising a control electrode connected to the second output control node, a first electrode connected to the second clock terminal, and a second electrode connected to the second output terminal.

13. The gate driving circuit of claim 10, wherein the second level control sub-circuit comprises a seventh transistor comprising a control electrode connected to the first scan terminal, a first electrode connected to the third clock terminal, and a second electrode connected to the third node, wherein the third level control sub-circuit comprises:

an eighth transistor comprising a control electrode connected to the third node, a first electrode connected to the first power supply terminal, and a second electrode connected to the third output control node;

a ninth transistor comprising a control electrode connected to the first node, a first electrode connected to the third output control node, and a second electrode connected to the second power supply terminal; and a second capacitor comprising a first terminal connected to the third output control node and a second terminal connected to the second power supply terminal, and wherein the reset sub-circuit comprises:

a tenth transistor comprising a control electrode connected to the third output control node, a first electrode connected to the second node, and a second electrode connected to the second power supply terminal;

an eleventh transistor comprising a control electrode connected to the third output control node, a first electrode connected to the first output terminal, and a second electrode connected to the second power supply terminal;

a twelfth transistor comprising a control electrode connected to the third output control node, a first electrode connected to the second output terminal, and a second electrode connected to the second power supply terminal; and a thirteenth transistor comprising a control electrode connected to the reset terminal, a first electrode connected to the reset terminal, and a second electrode connected to the third output control node.

14. The gate driving circuit of claim 10, wherein the second input sub-circuit comprises a fourteenth transistor comprising a control electrode connected to the second scan terminal, a first electrode connected to the first node, and a second electrode connected to the second input terminal, and wherein the fourth level control sub-circuit comprises a fifteenth transistor comprising a control electrode connected to the second scan terminal, a first electrode connected to the third node, and a second electrode connected to the fourth clock terminal.

15. A method of driving the shift register of claim 3, wherein the method comprises:

at an input phase, transferring, by one of the first input sub-circuit and the second input sub-circuit, a corresponding one of the first input signal and the second input signal to the first node, and transferring, by the first level control sub-circuit, the first power supply voltage at the first power supply terminal to the first output control node and the second output control node in response to the first node being at an active potential; and at an output phase subsequent to the input phase, transferring, by the output sub-circuit, the first clock signal at the first clock terminal to the first output terminal as the first output signal in response to the first output control node being at an active potential, and transferring, by the output sub-circuit, the second clock signal at the second clock terminal to the second output terminal as the second output signal in response to the second output control node being at an active potential.

16. The method of claim 15, further comprising:

at an initialization phase prior to the input phase, transferring, by the reset sub-circuit, the reset signal at the reset terminal to the third output control node in response to the reset signal at the reset terminal being active, and transferring, by the reset sub-circuit, the second power supply voltage at the second power supply terminal to the second node, the first output terminal and the second output terminal in response to the third output control node being at an active potential; and at a hold phase subsequent to the output phase, transferring, by the second level control sub-circuit, the third clock signal at the third clock terminal to the third node in response to the first scan signal at the first scan terminal being active, transferring, by the third level control sub-circuit, the first power supply voltage at the first power supply terminal to the third output control node in response to the third node being at an active potential, transferring, by the third level control sub-circuit, the second power supply voltage at the second power supply terminal to the third output control node in response to the first node being at an active potential, and transferring, by the reset sub-circuit, the second power supply voltage at the second power supply terminal to the second node, the first output terminal, and the second output terminal in response to the third output control node being at an active potential.

17. The method of claim 15, wherein the shift register further comprises: a first control terminal configured to receive a first control signal; and a second control terminal configured to receive a second control signal; a touch control sub-circuit; and a display control sub-circuit, the method further comprising:

transferring, by the touch control sub-circuit, the second power supply voltage at the second power supply terminal to the first output terminal and the second output terminal, in response to the first control signal at the first control terminal being active; and transferring, by the display control sub-circuit, the second control signal at the second control terminal to the first output terminal and the second output terminal, in response to the second control signal at the second control terminal being active.

18. The method of claim 15, wherein the transferring the input signal corresponding one of the first input signal and the second to the first node at the input phase comprises:

transferring, by the first input sub-circuit, the first input signal at the first input terminal to the first node in response to the shift register being in a forward scan mode in which the first scan signal is active; and transferring, by the second input sub-circuit, the second input signal at the second input terminal to the first node in response to the shift register being in a reverse scan mode in which the second scan signal is active.

19. A display device comprising the gate driving circuit of claim 10.

20. The display device of claim 19, wherein the first clock terminals of the N cascaded shift registers are configured to receive a same first clock signal, wherein the second clock terminals of the N cascaded shift registers are configured to receive a same second clock signal, wherein the third clock terminals of the N cascaded shift registers are configured to receive a same third clock signal, and wherein the fourth clock terminals of the N cascaded shift registers are configured to receive a same fourth clock signal.

* * * * *